(12) United States Patent
Pi et al.

(10) Patent No.: US 8,130,530 B2
(45) Date of Patent: Mar. 6, 2012

(54) INFORMATION STORAGE DEVICES USING MAGNETIC DOMAIN WALL MOVEMENT AND METHODS OF OPERATING THE SAME

(75) Inventors: Ung-hwan Pi, Seoul (KR); Young-soo Park, Yongin-si (KR); Sun-ae Seo, Hwaseong-si (KR); Young-jin Cho, Suwon-si (KR); Sung-chul Lee, Osan-si (KR); Ji-young Bae, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 83 days.

(21) Appl. No.: 12/591,774

(22) Filed: Dec. 1, 2009

(65) Prior Publication Data

US 2010/0135059 A1   Jun. 3, 2010

(30) Foreign Application Priority Data

Dec. 1, 2008  (KR) .................. 10-2008-0120691

(51) Int. Cl.
  *G11C 19/00*    (2006.01)

(52) U.S. Cl. ........................ 365/80; 365/171; 365/173

(58) Field of Classification Search ............ 365/80, 365/171, 173
See application file for complete search history.

(56) References Cited

U.S. PATENT DOCUMENTS

| | | | |
|---|---|---|---|
| 6,834,005 | B1 | 12/2004 | Parkin |
| 7,236,386 | B2 | 6/2007 | Parkin |
| 2007/0183188 | A1 | 8/2007 | Kim |
| 2007/0278603 | A1 | 12/2007 | Ochiai et al. |
| 2008/0080092 | A1 | 4/2008 | Kim |
| 2008/0137395 | A1* | 6/2008 | Hwang et al. .............. 365/80 |
| 2008/0138661 | A1* | 6/2008 | Lim et al. ................ 428/827 |
| 2009/0109740 | A1* | 4/2009 | Lee et al. ................ 365/171 |

FOREIGN PATENT DOCUMENTS

| | | |
|---|---|---|
| EP | 1 814 120 | 8/2007 |
| JP | 2007-073103 | 3/2007 |
| KR | 10-2007-0078203 | 7/2007 |
| KR | 10-0813270 | 3/2008 |

OTHER PUBLICATIONS

European Search Report dated Mar. 10, 2010.

* cited by examiner

*Primary Examiner* — Connie Yoha
(74) *Attorney, Agent, or Firm* — Harness, Dickey & Pierce, P.L.C.

(57) ABSTRACT

Provided are information storage devices using movement of magnetic domain walls and methods of operating information storage devices. An information storage device includes a magnetic track and an operating unit. The magnetic track includes a plurality of magnetic domains separated by magnetic domain walls. The size of the operating unit is sufficient to cover at least two adjacent magnetic domains. And, the operating unit may be configured to write/read information to/from a single magnetic domain as well as a plurality of magnetic domains of the magnetic track.

38 Claims, 17 Drawing Sheets

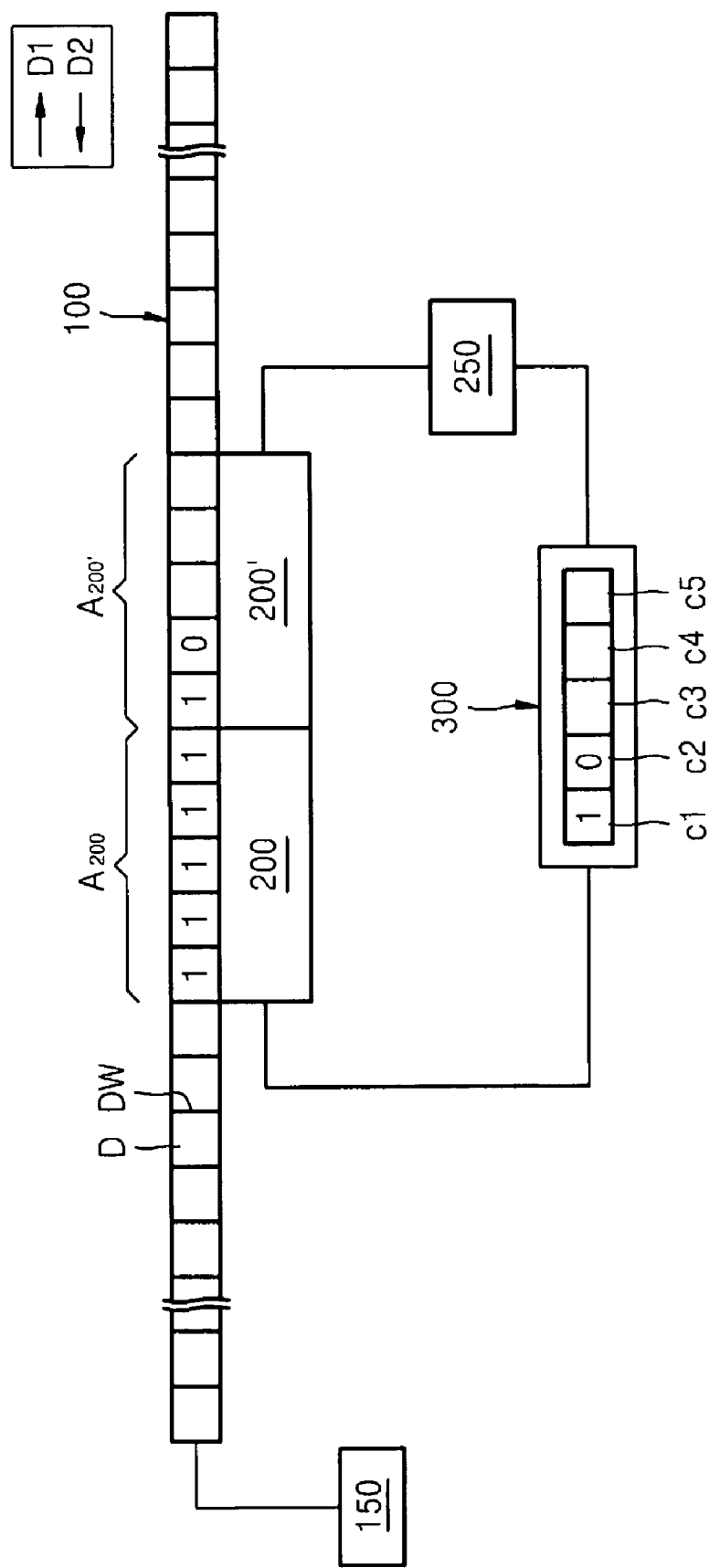

INFORMATION STORAGE DEVICES USING MAGNETIC DOMAIN WALL MOVEMENT AND METHODS OF OPERATING THE SAME

CROSS-REFERENCE TO RELATED APPLICATION(S)

This nonprovisional U.S. patent application claims priority under 35 U.S.C. §119 to Korean Patent Application No. 10-2008-0120691, filed on Dec. 1, 2008, in the Korean Intellectual Property Office, the entire contents of which is incorporated herein by reference.

BACKGROUND

1. Field

The general inventive concept relates to information storage devices using magnetic domain wall movement and methods of operating the same.

2. Description of the Related Art

Nonvolatile information storage devices retain recorded information even when power is cut-off. Examples of conventional nonvolatile information storage devices include hard disk drives (HDDs) and nonvolatile random access memories (RAMs). But, research has recently been conducted into development of new information storage devices using movement of magnetic domain walls within a magnetic material.

SUMMARY

One or more example embodiments include information storage devices using magnetic domain wall movement and methods of operating the same.

Additional example embodiments will be set forth in part in the description which follows, and in part, will be apparent from the description, or may be learned by practice of the general inventive concept.

One or more example embodiments provide an information storage device. According to at least this example embodiment, the information storage device includes a magnetic track and a first operating unit. The magnetic track includes a plurality of magnetic domains. Each pair of adjacent magnetic domains has a magnetic domain wall arranged there between. The first operating unit has a size sufficient to cover at least two magnetic domains among the plurality of magnetic domains. The first operating unit may be configured to at least one of read and write information from and to a single magnetic domain of the magnetic track, and configured to at least one of read and write data from and to a plurality of magnetic domains of the magnetic track.

The information storage device may further include a magnetic domain wall moving unit connected to the magnetic track. And, the information storage device may further include a temporary information storage device connected to the first operating unit. The temporary information storage device may be a non-volatile memory device and may include a plurality of memory cells. The total number of memory cells may be equal to the total number of magnetic domains covered by the first operating unit.

According to at least some example embodiments, the information storage device may further include a control device connected between the first operating unit and the temporary information storage device. The first operating unit may be one of a write unit, a read unit, and a read/write unit. More specifically, for example, the first operating unit may include a tunnel magneto-resistance (TMR) device or a giant magneto-resistance (GMR) device.

The information storage device may further include a second operating unit separated from the first operating unit. One of the first and second operating units may be a write unit and the other may be a read unit. The second operating unit may cover at least two continuous magnetic domains from among the plurality of magnetic domains. The total number of magnetic domains covered by the first operating unit may be equal to the total number of magnetic domains covered by the second operating unit. The second operating unit may include a tunnel magneto-resistance (TMR) device or a giant magneto-resistance (GMR) device. The first and second operating units may be disposed adjacent to or separate from each other. For example, the first operating unit may be disposed at one end of the magnetic track, whereas the second operating unit may be disposed at another (e.g., opposite) end of the magnetic track. The temporary information storage device may be connected to the first and second operating units.

According to at least some example embodiments, the information storage device may include a plurality of operating units disposed on the magnetic track. The plurality of operating units may include or be in addition to the first operating unit. The plurality of operating units (and the first operating unit) may be separated from one another on the magnetic track.

One or more example embodiments provide a method of operating an information storage device. According to at least this example embodiment, the device includes a magnetic track, a magnetic domain wall moving unit and an operating unit. The magnetic track includes a plurality of magnetic domains. Each pair of adjacent magnetic domains is separated by a magnetic domain wall. The magnetic domain wall moving unit is connected to the magnetic track. The operating unit has a size sufficient to cover at least two magnetic domains from among the plurality of magnetic domains.

In the method according to at least this example embodiment, information is recorded on the magnetic track. The recording of the information includes: magnetizing all the magnetic domains covered by the operating unit in a first direction by supplying a first write current to the operating unit. After the supplying of the first write current, the magnetic domain walls of the magnetic track are moved by at least one bit. After moving the magnetic domain walls by at least one bit, the all the magnetic domains covered by the operating unit are magnetized in a second direction by supplying a second write current to the operating unit. The first direction and the second direction are opposite to one another.

According to at least some example embodiments, the recording of the information further includes: moving the magnetic domain walls of the magnetic track by at least one bit after supplying the second write current. Before recording the information, all the magnetic domains of the magnetic track may be magnetized in the same direction.

The information storage device may further include a temporary information storage device connected to the operating unit. The temporary information storage device may include a plurality of memory cells. The total number of memory cells may be equal to the total number of the magnetic domains covered by the operating unit. The method may further include: storing information recorded on the magnetic track in the temporary information storage device.

The information recorded on the magnetic track may be reproduced. The information stored in the temporary information storage device may be used for reproducing the information. The reproducing of the information may be performed using the operating unit or an additional read unit. The reproducing of the information may include a first operation, a second operation and a third operation. In the first operation, information is read from the magnetic domains covered by the operating unit or from magnetic domains covered by the additional read unit. In the second operation, the magnetic domain walls of the magnetic track are moved by one bit. In the third operation, information is read from magnetic domains covered by the operating unit or the read unit after performing the second operation. The reproducing of the information may include storing the information read in the first operation in the temporary information storage device.

To reproduce the information, the type of information of a magnetic domain moved to a first region of the magnetic track in the second operation is determined by comparing the information read in the third operation with the information stored in the temporary information storage device. The first region of the magnetic track corresponds to a region of the magnetic track on which the operating unit or the read unit is disposed.

After determining of the type of information, the information in the temporary information storage device may be equalized with the information read in the third operation.

One or more other example embodiments provide a method of operating an information storage device. According to at least this example embodiment, the information storage device includes a magnetic track having a plurality of magnetic domains. Each pair of adjacent magnetic domains is separated by a magnetic domain wall. The information storage device further includes a magnetic domain wall moving unit connected to the magnetic track, and an operating unit having a size sufficient to cover at least two magnetic domains from among the plurality of magnetic domains. The method according to this example embodiment includes: moving the magnetic domain walls of the magnetic track by one bit; and determining the type of information of a magnetic domain moved to a first region of the magnetic track by the movement of the magnetic domain walls. The first region of the magnetic track corresponds to a region of the magnetic track on which the operating unit is disposed.

In determining the type of information, the information stored in the first region after the movement of the magnetic domain walls is compared with information stored in the first region before the movement of the magnetic domain walls.

The information storage device may further include a temporary information storage device for storing the information stored in the first region before the movement of the magnetic domain walls. After determining the type of information, the information in the temporary information storage device may be equalized with the information stored in the first region after the movement of the magnetic domain walls.

Information moved out from the first region by the movement of the magnetic domain walls may be checked. The method by which the type of information is determined may be selected according to the type of the information moved out from the first region.

At least one example embodiment provides an information storage device. According to at least this example embodiment, the information storage device includes a magnetic track and a means for recording data to a single magnetic domain and a plurality of magnetic domains of the magnetic track. The magnetic track includes a plurality of magnetic domains and a magnetic domain wall between each pair of adjacent magnetic domains. The means for recording has a size sufficient to cover at least two magnetic domains among the plurality of magnetic domains. The means for recording may include an operating unit, for example, a write unit or a read/write unit.

The means for recording data may be disposed on a first region of the magnetic track. The information storage device may further include means for reproducing data from the magnetic track and a means for temporarily storing information read from the first region. The means for reproducing data may have a size sufficient to cover at least two magnetic domains among the plurality of magnetic domains. The information storage device may further include a means for moving the magnetic domains in the magnetic track. The means for temporarily storing information may be a temporary storage device. The means for moving the magnetic domains in the magnetic track may be a magnetic domain wall moving unit.

At least one other example embodiment provides an information storage device. According to at least this example embodiment, the information storage device includes a magnetic track and a means for reproducing data from a single magnetic domain and a plurality of magnetic domains of the magnetic track. The magnetic track includes including a plurality of magnetic domains and a magnetic domain wall between each pair of adjacent magnetic domains. The means for reproducing data has a size sufficient to cover at least two magnetic domains among the plurality of magnetic domains. The means for reproducing data may be an operating unit, for example, a read unit or a read/write unit.

According to at least some example embodiments, the means for reproducing data is disposed on a first region of the magnetic track. The information storage device further includes a means for temporarily storing information read from the first region and/or a means for moving the magnetic domains in the magnetic track.

At least one other example embodiment provides an information storage device. According to at least this example embodiment, the information storage device includes a magnetic track, an operating unit and a magnetic domain wall moving unit. The magnetic track includes a plurality of magnetic domains. Each pair of adjacent magnetic domains is separated by a magnetic domain wall. The operating unit has a size enough sufficient to cover at least two adjacent magnetic domains among the plurality of magnetic domains. The magnetic domain wall moving unit is connected to the magnetic track, and is configured to move the magnetic domain walls in the magnetic track by a number of magnetic domains, wherein the number of magnetic domains is less than the number of adjacent magnetic domains covered by the operating unit.

The information storage device may further include a temporary information storage device and a control device. The temporary information storage device may be connected to the operating unit. The control device may be connected between the operating unit and the temporary information storage device. The control device being may be configured to detect information read from or written to the magnetic track.

BRIEF DESCRIPTION OF THE DRAWINGS

The general inventive concept will become apparent and more readily appreciated from the following description of example embodiments, taken in conjunction with the accompanying drawings in which:

FIGS. 12A to 12C are cross-sectional views illustrating a method of operating the information storage device of FIG. 11 according to an example embodiment.

DETAILED DESCRIPTION

Figure 1:
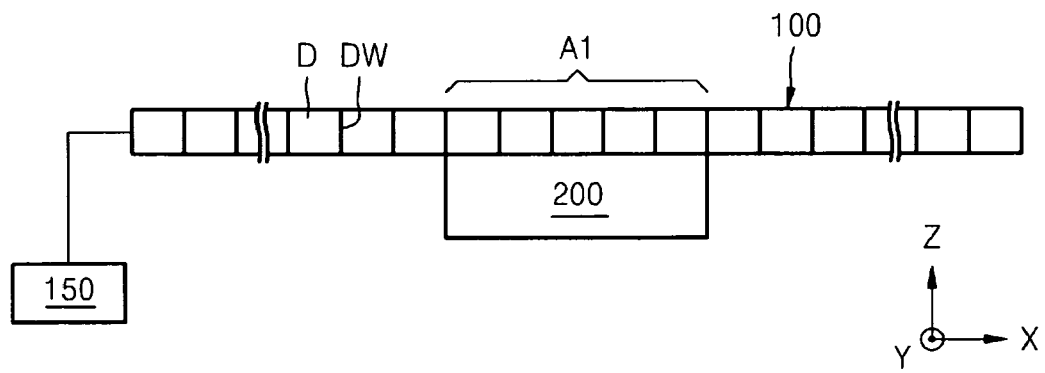
FIGS. 1 to 4 are cross-sectional views of information storage devices according to example embodiments.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. The general inventive concept may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular example embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

Example embodiments provide information storage devices and methods of operating the same. In at least one example embodiment, an information storage device includes a magnetic track having a plurality of magnetic domains separated by magnetic domain walls. An operating unit (e.g., a read unit, a write unit, or a read/write unit) is disposed on the magnetic track. The operating unit has a size sufficient cover more than one (e.g., at least two) adjacent (or continuous) magnetic domain, while being capable of writing information (e.g., a single bit of information) to a single magnetic track, and being capable of writing a plurality of bits of information (e.g., multi-bit information) to a plurality of magnetic domains (e.g., simultaneously).

In another example embodiment, an information storage device includes a magnetic track, an operating unit and a magnetic domain wall moving unit. In this example embodiment, the operating unit has a size enough sufficient to cover at least two adjacent magnetic domains among the plurality of magnetic domains, and the magnetic domain wall moving unit is connected to the magnetic track. The magnetic domain wall moving unit is configured to move the magnetic domain walls in the magnetic track by a number of magnetic domains, wherein the number of magnetic domains is less than the number of adjacent magnetic domains covered by the operating unit.

FIG. 1 is a cross-sectional view of an information storage device according to an example embodiment.

Referring to the example embodiment shown in FIG. 1, the information storage device includes a magnetic track 100 extending in a given, desired or predetermined direction (e.g., an X-axis direction). The magnetic track 100 may be an information storage track composed of a ferromagnetic material and including a plurality of continuous magnetic domain regions D. A magnetic domain wall region DW is arranged between each pair of adjacent magnetic domain regions D. Although the magnetic domain wall region DW is illustrated two-dimensionally (2D) in the drawings, it may actually be a three-dimensional (3D) region with a given, desired or predetermined volume.

The magnetic domain wall region DW may be, for example, an impurity-doped region or a region having notches. The notches may be formed along both side surfaces of the magnetic track 100 in the Y-axis direction. The magnetic domain wall regions DW define the magnetic domain regions D accordingly.

Still referring to FIG. 1, the information storage device further includes a magnetic domain wall moving unit 150 connected to the magnetic track 100. The magnetic domain wall moving unit 150 may include a power source. The power source may be a current source configured to generate a pulse current. The magnetic domain wall moving unit 150 may further include a switching device (e.g., a transistor or diode). The switching device may be connected between the power source and the magnetic track 100.

Although FIG. 1 illustrates that the magnetic domain wall moving unit 150 is connected to one end of the magnetic track 100, the magnetic domain wall moving unit 150 may be connected to the other end or both ends of the magnetic track 100. Magnetic domains D and magnetic domain walls DW in the magnetic track 100 move in a given, desired or predetermined direction in response to a current supplied by the magnetic domain wall moving unit 150. Current flows in a direction opposite to the flow of electrons. And, the magnetic domains D and the magnetic domain walls move in the same direction as the flow of electrons. Thus, the magnetic domains D and the magnetic domain walls DW also move in a direction opposite to the current flow.

Still referring to FIG. 1, the information storage device further includes a first unit 200. The first unit 200 is also referred to as an operating unit. In the example embodiment shown in FIG. 1, the first unit 200 is provided on a bottom surface of a first region A1 of the magnetic track 100. The first unit 200 covers magnetic domains D magnetic domain walls DW arranged there between in the first region A1. In FIG. 1, the first region A1 includes five magnetic domains D and the magnetic domain walls DW arranged there between. In alternative example embodiments, however, the first region A1 may include two or more magnetic domain regions D and magnetic domain wall region(s) DW arranged there between. More generally, for example, the first unit 200 may have a size sufficient to cover at least two continuous magnetic domain regions D among the plurality of magnetic domain regions D in the magnetic track 100.

The first unit 200 may be an operating unit, such as, a write unit, a read unit, or a read/write unit. In more detail, the first unit 200 may be a device using the tunnel magneto-resistance (TMR) effect (e.g., a TMR device) or the giant magneto-resistance (GMR) effect (e.g., a GMR device).

Although FIG. 1 illustrates that the first unit 200 is located on a bottom surface of the first region A1, the first unit 200 may be located on a top surface of the first region A1. In another alternative, the first unit 200 may be divided between the top and bottom surfaces of the first region A1. Example embodiments of the first unit 200 will be described in more detail later with regard to FIGS. 5 and 6.

Figure 2:
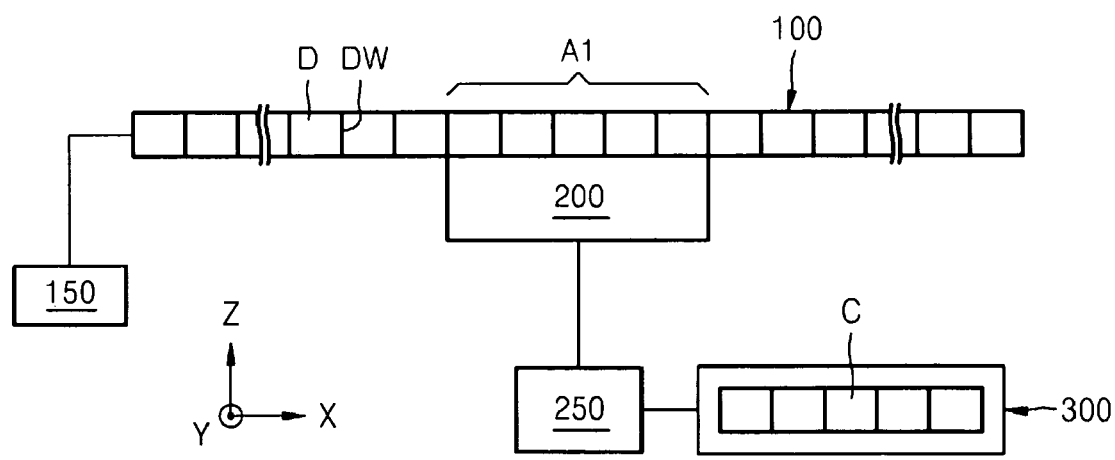

FIG. 2 illustrates an information storage device according to another example embodiment.

Referring to FIG. 2, in addition to the magnetic track 100, the first unit 200 and the magnetic domain wall moving unit 150, the information storage device further includes a temporary storage device 300 connected to the first unit 200. The temporary storage device 300 may temporarily store information read from one or more magnetic domains D the first region A1 by the first unit 200. The temporary storage device 300 may also store information recorded on the magnetic track 100 by the first unit 200. The temporary storage device 300 may be a general non-volatile memory device, such as, a static random access memory (SRAM), a flash memory (e.g., a NAND, flash memory, a NOR flash memory, etc.), or other type of memory.

The temporary storage device 300 includes a plurality of memory cells C. The total number of memory cells C may be equal to the total number of magnetic domain regions D in the first region A1 of the magnetic track 100, which is the region on which the first unit 200 is formed. The temporary storage device 300 may be relatively small in size, and may be formed relatively easily according to conventional semiconductor manufacturing processes. The temporary storage device 300 may not largely affect the recording density and degree of integration of the information storage device.

Still referring to FIG. 2, the information storage device further includes a control device 250 connected between the first unit 200 and the temporary storage device 300. According to at least this example embodiment, the control device 250 measures resistance and performs logic arithmetic operations. The control device 250 may be configured to detect information stored in the first region A1, detect information stored in the temporary storage device 300, compare the detected information, and store the information read from the first region A1 by the first unit 200 in the temporary storage device 300.

In somewhat more detail, an example embodiment of the control device 250 may include at least one sensor unit and at least one logic device connected to the at least one sensor unit. The at least one sensor unit may detect (or sense) the information stored in the first region A1 and information stored in the temporary storage device 300. The at least one logic device may compare the information stored in the first region A1 with the information stored in the temporary storage device 300.

The control device 250 may further include a current-control device for recording information. The current-control device enables the control device 250 to store information read from the first region A1 in the temporary storage device 300.

Figure 3:
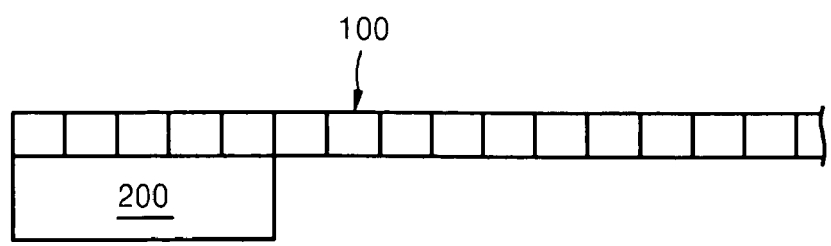
Figure 4:
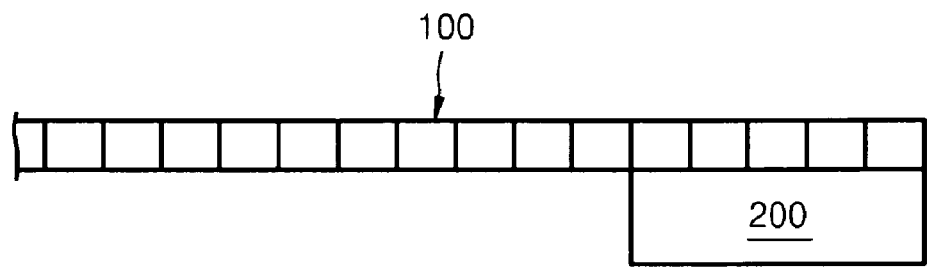

Although FIGS. 1 and 2 illustrate the first region A1 located at a central portion of the magnetic track 100, the location of the first unit 200 is not limited thereto. For example, as illustrated in FIGS. 3 and 4 the first unit 200 may be formed at an end of the magnetic track 100. Although not shown in the drawings, the information storage devices illustrated in FIGS. 3 and 4 may also include the magnetic domain wall moving unit 150 of FIG. 1, the control device 250 and/or the temporary storage device 300 of FIG. 2.

The construction of the first unit (operating unit) 200 illustrated in FIGS. 1 through 4 will now be described in more detail with reference to FIGS. 5 and 6.

Figure 5:
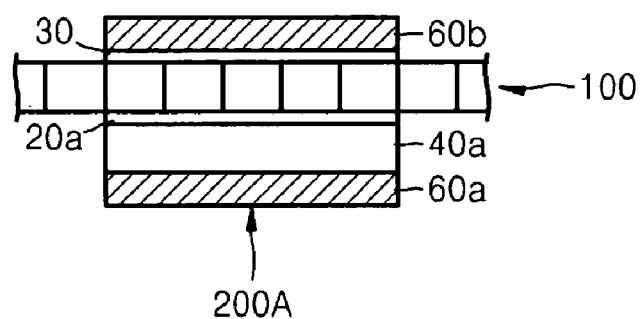
FIGS. 5 and 6 are cross-sectional views of operating units according to example embodiments.

Referring to FIG. 5, in this example embodiment the first unit (operating unit) 200A includes a first pinned layer 40a formed on a bottom surface of the magnetic track 100. Although the first pinned layer 40 is formed on the bottom surface of the magnetic track 100 in FIG. 5, the first pinned layer 40a may be formed on either of the top and bottom surface of the magnetic track 100. In the example embodiment shown in FIG. 5, a first separation layer 20a is interposed between the first pinned layer 40a and the magnetic track 100. The first separation layer 20a may be an insulating layer or a conductive layer.

If the first separation layer 20a is an insulating layer, the first unit 200A is a TMR device. If the first separation layer 20a is a conductive layer, the first unit 200A is a GMR device.

According to example embodiments, a region of the magnetic track 100 on which the first unit 200A is disposed may be considered part of the first unit 200A.

Still referring to the example embodiment shown in FIG. 5, the first unit 200A further includes a first electrode 60a formed at the bottom of the first pinned layer 40a, and a second electrode 60b formed on the magnetic track 100. A resistive layer 30 is formed between the second electrode 60b and the magnetic track 100. The resistive layer 30 may have a higher electrical resistance than the magnetic track 100. When current is supplied to the magnetic track 100 to move magnetic domains and magnetic domain walls, the resistive layer 30 functions as an electrical barrier that suppresses and/or prevents the current from leaking into the first unit 200A. When current is supplied between the first electrode 60a and the second electrode 60b, however, current flow is not disrupted due to the resistive layer 30. To this end, the resistive layer 30 may be formed of a material having an appropriate electrical resistance and a relatively small thickness. For example, the resistive layer 30 may have a resistivity between about 500 and about 10,000 times, inclusive, (e.g., from about 1000 to about 3000 times, inclusive) higher than the specific resistance of the magnetic track 100. To obtain the difference between the resistivity of the resistive layer 30 and the magnetic track 100, the magnetic track 100 may be formed of a material selected from a group including NiFe, Co, CoNi, CoFe, CoCr, CoCu, NiCu, FePt, FePd, CoCrPt, CoFeTb, CoFeGd, CoTb CoFeNi, a combination thereof or the like. The resistive layer 30 may be formed of a material having a relatively high resistivity, for example, one of CoZrNb and CoFeB, which are amorphous materials, and a magnetic material that contains impurities such as Si and B.

If the first separation layer 20a is a conductive layer, a resistive layer similar to or the same as the resistive layer 30 may be formed between the magnetic track 100 and the first separation layer 20a.

Although not shown in FIG. 5, at least one additional layer may be formed between the first pinned layer 40a and the first electrode 60a to pin the magnetization direction of the first pinned layer 40a. The at least one additional layer may be an anti-ferromagnetic layer. The construction of a layer (or layers) for pinning the magnetization direction of the first pinned layer 40a is well known in the art, and thus, a detailed description thereof is omitted. A free layer may also be formed between the first pinned layer 40a and the first separation layer 20a. In this example, another separation layer may be formed between the free layer and the first pinned layer 40a.

Figure 6:
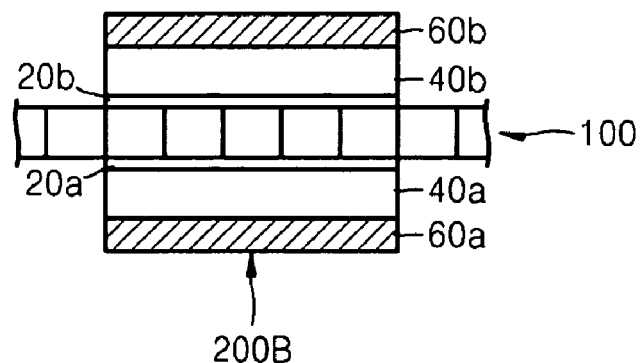

FIG. 6 is a cross-sectional view of a first unit (operating unit) according to another example embodiment.

Referring to FIG. 6, the first unit (operating unit) 200B includes a first pinned layer 40a arranged on the bottom surface of the magnetic track 100 and a second pinned layer 40b arranged on the top surface on the magnetic track 100. The magnetization direction of the first pinned layer 40a may be opposite to that of the second pinned layer 40b. A first separation layer 20a is formed between the first pinned layer 40a and the magnetic track 100. A second separation layer 20b is formed between the second pinned layer 40b and the magnetic track 100. The first separation layer 20a and the second separation layer 20b may be insulating layers or conductive layers.

If the first separation layer 20a and the second separation layer 20b are conductive layers, a resistive layer (e.g., similar to or the same as the resistive layer 30 shown in FIG. 5) may be formed between the first separation layer 20a and the magnetic track 100. A resistive layer (e.g., similar to or the same as the resistive layer 30 shown in FIG. 5) may also be formed between the second separation layer 20b and the magnetic track 100.

Still referring to the example embodiment shown in FIG. 6, a first electrode 60a is formed at the bottom of the first pinned layer 40a and a second electrode 60b is formed on the second pinned layer 40b.

If information is recorded using the first unit 200 in which the first and second pinned layers 40a and 40b have opposite magnetization directions, a spin transfer torque may be applied from the first and second pinned layers 40a and 40b to the magnetic track 100. Thus, information may be recorded using a smaller amount of current when using the first unit 200B of FIG. 6 as compared to when using the first unit 200A of FIG. 5.

Although not shown in FIG. 6, a free layer may also be formed between the first pinned layer 40a and the first separation layer 20a and/or between the second pinned layer 40b and the second separation layer 20b. In this example, another separation layer (e.g., similar to or the same as the separation layers 20a and 20b) may be disposed between the free layer and the corresponding pinned layer 40a or 40b.

Methods of recording information and methods of reproducing information according to example embodiments will now be described. As discussed herein, methods are described with regard to recording information and reproducing information. However, the terms writing information and reading information may also be used.

FIGS. 7A to 7E are cross-sectional views illustrating an example embodiment of a method of recording information on an information storage device. The example embodiment shown in FIGS. 7A to 7E will be described with regard to an information storage device in which the first unit 200A of FIG. 5 is arranged at an end of a magnetic track 100. In this example, the first unit 200A is a write unit or a read/write unit. And, the first pinned layer 40a is magnetized in a first direction D1 (e.g., the X-axis direction). An arrow on the first pinned layer 40a indicates the magnetization direction of the first pinned layer 40a. Also, in FIGS. 7A to 7E, the portion of the magnetic domain regions D covered by the first unit 200A is referred to herein as magnetic domain region $A_7$.

Figure 7A:
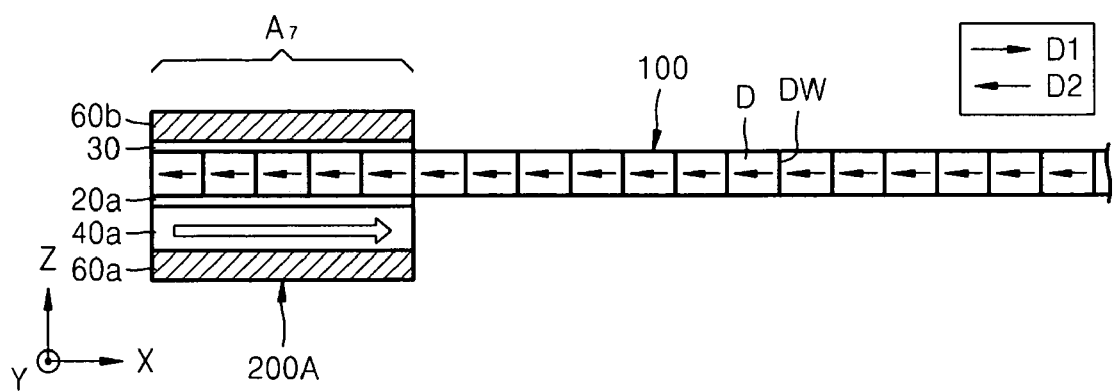
FIGS. 7A to 7E are cross-sectional views illustrating a method of recording information in an information storage device according to an example embodiment.

Referring to FIG. 7A, in a beginning stage all magnetic domain regions D of the magnetic track 100 are magnetized in a second direction D2 (e.g., a direction opposite to the X-axis direction). To do so, before information is recorded, an initialization process in which all the magnetic domain regions D of the magnetic track 100 are magnetized in the same direction may be performed. The initialization process may be performed in various ways. For example, all the magnetic domain regions D of the magnetic track 100 may be magnetized in the same direction by supplying a write current to the first unit 200A in one direction so that all magnetic domains of the magnetic track 100 pass through the first unit 200A. The initialization process, however, is optional. In some example embodiments, some of the magnetic domain regions D may be magnetized in the first direction D1, while other magnetic domain regions D may be magnetized in the second direction D2. Alternatively, some or all magnetic domain regions D may not be magnetized in any specific direction.

Figure 7B:
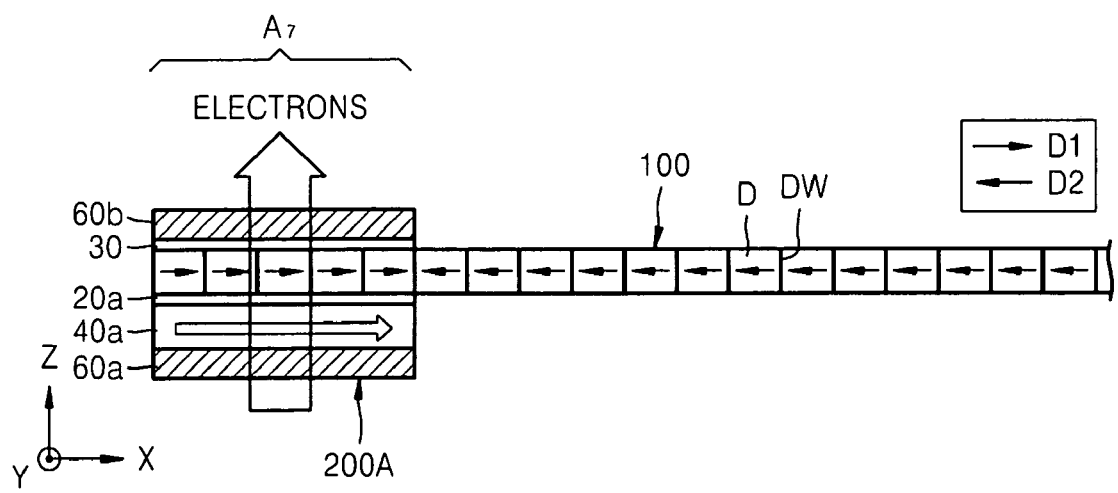

Referring to FIG. 7B, when a first write current is supplied from the second electrode 60b to the first electrode 60a, electrons move from the first electrode 60a to the second electrode 60b. The movement of the electrons changes the magnetization direction of the magnetic domain regions D in magnetic domain region $A_7$ to the first direction D1. More specifically, for example, the magnetization direction of the magnetic domain regions D in the magnetic domain region $A_7$ becomes the same as the magnetization direction of the first pinned layer 40a. This is primarily because only electrons with a spin direction corresponding to the first direction D1 pass through the first pinned layer 40a, thereby applying a spin transfer torque to the magnetic track 100.

Figure 7C:
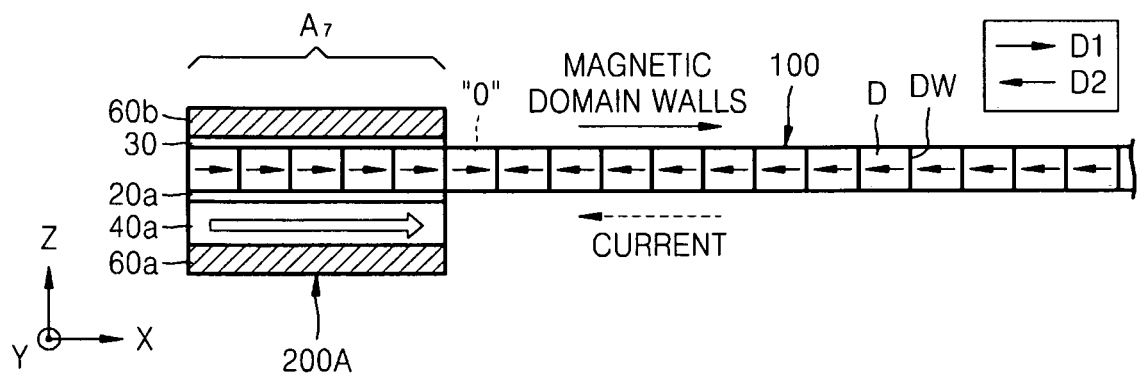

Referring to FIG. 7C, when a magnetic domain wall moving current is supplied to the magnetic track 100 in the second direction D2, the magnetic domain walls DW move by one bit within the magnetic track 100 in the first direction D1. Thus, the magnetic domain region D located adjacent to the magnetic domains D in the magnetic domain region $A_7$ in the right direction is magnetized in the first direction D1. In this example, the magnetic domain D adjacent to the magnetic domain region $A_7$ corresponds to information '0'. The left most magnetic domain in the magnetic domain region $A_7$ is also magnetized in the first direction D1 because the left-most magnetic domain in the magnetic domain region $A_7$ extends to the magnetic domain region closest to the left-most magnetic domain when the magnetic domain walls move in the right direction. In alternative example embodiments, if another magnetic domain region is present adjacent to the magnetic domains region $A_7$ in the left direction, this magnetic domain moves by one bit in the right direction and becomes the left-most magnetic domain in the magnetic domain region $A_7$.

Figure 7D:
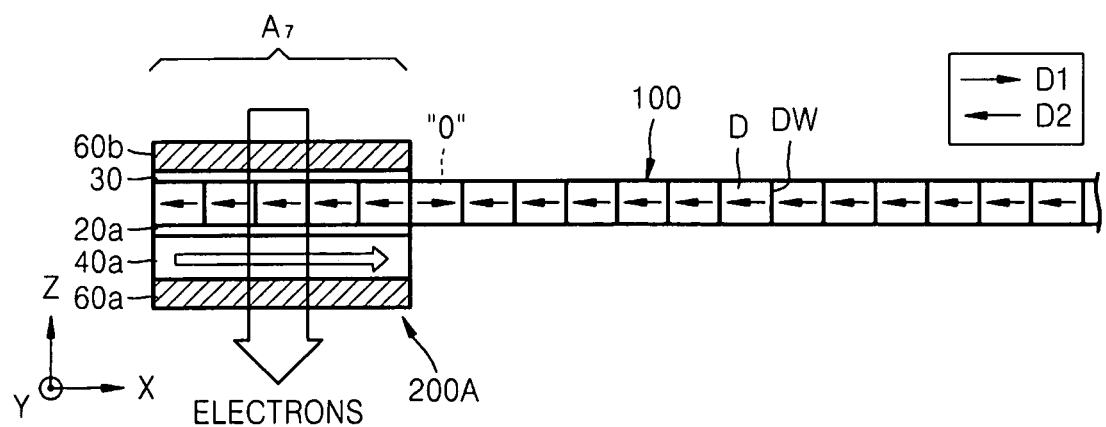

Referring to FIG. 7D, when a second write current is supplied in a direction from the first electrode 60a to the second electrode 60b, electrons move from the second electrode 60b to the first electrode 60a. The movement of the electrons changes the magnetization direction of the magnetic domain regions D in the magnetic domain region $A_7$ to the second direction D2 (e.g., a direction opposite to the direction of magnetization of the first pinned layer 40a). This is because electrons with a spin direction corresponding to the first direction D1 pass through the first pinned layer 40a and are thus discharged from the first electrode 60a, whereas electrons with a spin direction corresponding to the second direction D2 do not pass through the first pinned layer 40a. Instead, these electrons return to the magnetic track 100, thereby applying a spin transfer torque onto the magnetic track 100.

Figure 7E:
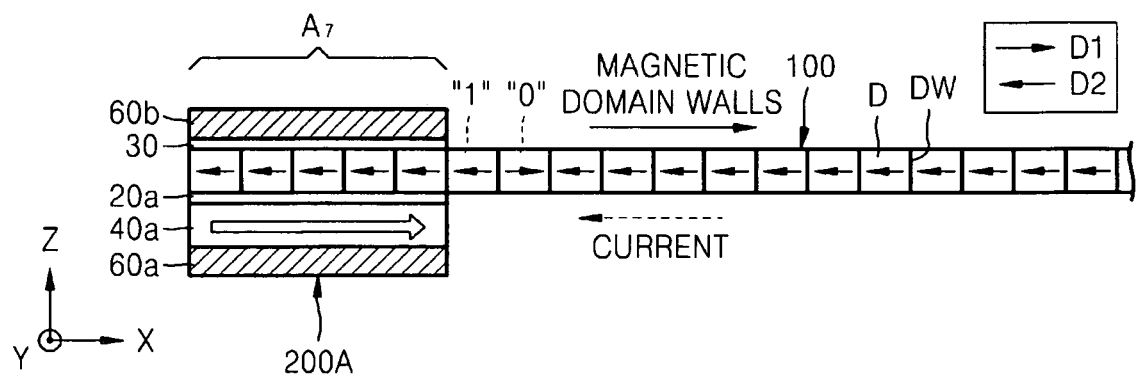

Referring to FIG. 7E, when magnetic domain wall moving current is supplied to the magnetic track 100 in the second direction D2, the magnetic domain walls move by one bit within the magnetic track 100 in the first direction D1. Thus, the magnetic domain region D adjacent to the right of the magnetic domain region $A_7$ is magnetized in the second direction D2. In this example, the magnetic domain magnetized in the second direction D2 corresponds to information '1'. In this example, the magnetic domain previously adjacent to the right of the magnetic domain region $A_7$ in FIG. 7C (e.g., the magnetic domain corresponding to information '0') moves by one bit in the right direction.

Referring back to FIG. 7C, before performing the operations shown in FIGS. 7D and 7E, if the magnetic domain walls are moved once more in the right direction, information '0' may be recorded on two magnetic domain regions D adjacent to the magnetic domain region $A_7$ in the right direction.

Similarly, as illustrated in FIG. 7E, if the magnetic domain walls are moved again in the right direction, information '1' may be recorded in the two magnetic domain regions D adjacent to the magnetic domain region $A_7$ in the right direction.

As described above, information may be recorded on the magnetic track 100, by repeatedly supplying a given, desired, or predetermined write current to the first unit 200A and moving the magnetic domain walls by at least one bit within the magnetic track 100.

Although not shown in FIGS. 7A to 7E, a temporary storage device (e.g., the temporary storage device 300 shown in FIG. 2) may be connected to the first unit 200A. In this example, information recorded in the magnetic track 100 via the first unit 200A may be stored in the temporary storage device. More specifically, for example, in the operation shown in FIG. 7B information '0' may be stored in a first cell of the temporary storage device. In the operation shown in FIG. 7C, the information '0' stored in the first cell of the temporary information storage device may be moved to a second cell of the temporary storage device.

In the operation shown in FIG. 7D, information '1' may be stored in the first cell of the temporary storage device, and in the operation shown in FIG. 7E, the information stored in the first and second cells may be moved to the second and third cells, respectively.

More generally, in the operations shown in FIGS. 7C and 7E, information stored in an Nth cell of the temporary storage device may be moved to an N+1th cell of the temporary storage device. In this way, information recorded in the magnetic track 100 may be stored in the temporary storage device. Thus, when recording is completed, the last five pieces of information recorded in the magnetic track 100 may also be stored in the temporary storage device. As will be described in more detail later, information stored in the temporary storage device may be used for reproducing information from the magnetic track 100.

A method of recording information by using the first unit 200B of FIG. 6 may be similar or substantially similar to the method illustrated in FIGS. 7A to 7E. However, if the first unit 200B of FIG. 6 is used, a spin transfer torque may be applied to the magnetic track 100 from the first and second pinned layers 40a and 40b below and above (e.g., on) the magnetic track 100, thereby performing recording with a relatively small amount of current.

A basic principle of reproducing information will now be described before describing methods of reproducing information according to example embodiments in more detail.

Referring back to FIG. 5, in at least this example embodiment the first unit 200A covers a total of five magnetic domain regions D. Information '0' or '1' may be recorded in each of the five magnetic domain regions D. If the magnetization direction of information '0' is the same as that of the first pinned layer 40a, then the magnetization direction of the information '1' is opposite to that of the first pinned layer 40a. Said another way, if the magnetization direction of information '0' is parallel to that of the first pinned layer 40a, then the magnetization direction of information '1' is anti-parallel to that of the first pinned layer 40a.

The magnitude of a reproducing current may vary according to the total number of information (e.g., bits) '1' stored in the five magnetic domain regions D covered by the first unit 200A. As the number of magnetic domain regions D among the magnetic domain regions D covered by the first unit 200A having a magnetization direction anti-parallel to that of the first pinned layer 40a increases, the magnitude of the reproducing current decreases.

In addition, the reproducing current may be supplied between the first electrode 60a and the second electrode 60b or between the first electrode 60a and one end of the magnetic track 100. Even if the reproducing current is supplied between the first electrode 60a and one end of the magnetic track 100, the reproducing current may not be influenced (e.g., greatly influenced) by the magnetization state of the remaining magnetic domain regions D except for those covered by the first unit 200A. For example, the magnetized state of the magnetic domain regions D covered by the first unit 200A may be a significant (e.g., a dominant) factor determining the magnitude of the reproducing current. In the case of the first unit 200B shown in FIG. 6, the reproducing current may be supplied between one of the first electrode 60a and the second electrode 60b and one end of the magnetic track 100.

Figure 8:
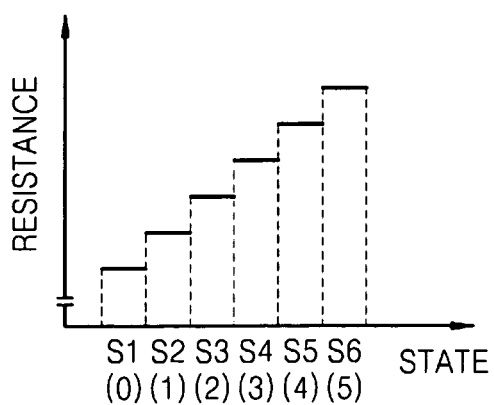
FIG. 8 is a graph illustrating resistance states according to the state of a read unit according to an example embodiment.

FIG. 8 is a graph illustrating resistance states according to the state of a read unit included in an information storage device according to an example embodiment. In more detail, FIG. 8 is a graph illustrating variations in the magnitude of the reproducing current according to the total number K of magnetic domain regions D among the five magnetic domain regions D covered by the first unit 200A in FIG. 5 having a magnetization direction anti-parallel to that of the first pinned layer 40a. The magnitude of the reproducing current is in the form of an electric resistance between the first and second electrodes 60a and 60b or between the first electrode 60a and one end of the magnetic track 100 (hereinafter referred to as 'resistance measured by the first unit 200A').

Referring to FIG. 8, the total number of magnetic domain regions D covered by the first unit 200A in FIG. 5 and having a magnetization direction parallel to that of the first pinned layer 40a is (5-K). In FIG. 8, reference numerals S1 to S6 denote various possible states (first through sixth states, respectively) of the first unit 200A. The numbers (0) to (5)

correspond to states S1 to S6, respectively, and denote the total number K of magnetic domain regions D having a magnetization direction anti-parallel to that of the first pinned layer 40a.

Referring to FIG. 8, in this example, the total number K of magnetic domain regions D having a magnetization direction anti-parallel to that of the first pinned layer 40a may range from 0 to 5. An increase in the total number of magnetic domain regions D having a magnetization direction anti-parallel to that of the first pinned layer 40a results in an increase in the resistance measured at the first unit 200A.

The graph of FIG. 8 is supported by mathematical and theoretical calculation. As shown in FIG. 5, for example, the magnetic domain regions D are connected in parallel between the first electrode 60a and the second electrode 60b. If it is assumed that a magnetic ratio MR is 100%, and resistance $R_{AP}$ in the anti-parallel state is twice the resistance $R_P$ in the parallel state, the total resistance $R_T$ may be expressed by Equation (1) shown below.

$$\frac{1}{R_T} = \frac{(N-K)}{R_P} + \frac{K}{R_{AP}} = \frac{(2N-K)}{2R_P} \quad (1)$$

In Equation (1), N denotes the total number of magnetic domain regions D covered by the first unit 200A, and K denotes the total number of magnetic domain regions D covered by the first unit 200 and having a magnetization direction anti-parallel to that of the first pinned layer 40a.

If N is 5 in Equation (1), the total resistance $R_T$ may be expressed as Equation (2) shown below.

$$R_T = \frac{2R_P}{10-K} \quad (2)$$

In Equation (2), K may be 0, 1, 2, 3, 4 or 5. If K is 0, 1, 2, 3, 4 or 5, the total resistance $R_T$ is $0.2 \times R_P$, $0.222 \times R_P$, $0.25 \times R_P$, $0.286 \times R_P$, $0.333 \times R_P$ or $0.4 \times R_P$, respectively. The mathematical calculation also reveals that an increase in the total number K results in an increase in the total resistance $R_T$.

An example embodiment of a method of reproducing information will now be described with reference to FIGS. 9A to 9G. This example embodiment is described with regard to an information storage device in which the first unit 200A of FIG. 5 is disposed on a given, desired, or predetermined region of a magnetic track 100. As also shown in FIGS. 9A-9G, the first unit 200A is connected to the control device 250 and the temporary storage device 300 as shown in FIG. 2. In this example, the first unit 200A is a read unit or a read/write unit and a first pinned layer 40a is magnetized in a first direction D1. An arrow marked on the first pinned layer 40a indicates a magnetization direction thereof.

In FIGS. 9A to 9G and 10A to 10E, magnetic domain regions D labeled with '0' are magnetized in the first direction D1, whereas magnetic domain regions D labeled with '1' are magnetized in a second direction D2. Hereinafter, a region of the magnetic track 100 on which the first unit 200A is located is referred to as magnetic domain region $A_9$. The magnetic domain region $A_9$ includes first through fifth magnetic domain regions d1 to d5.

Figure 9A:
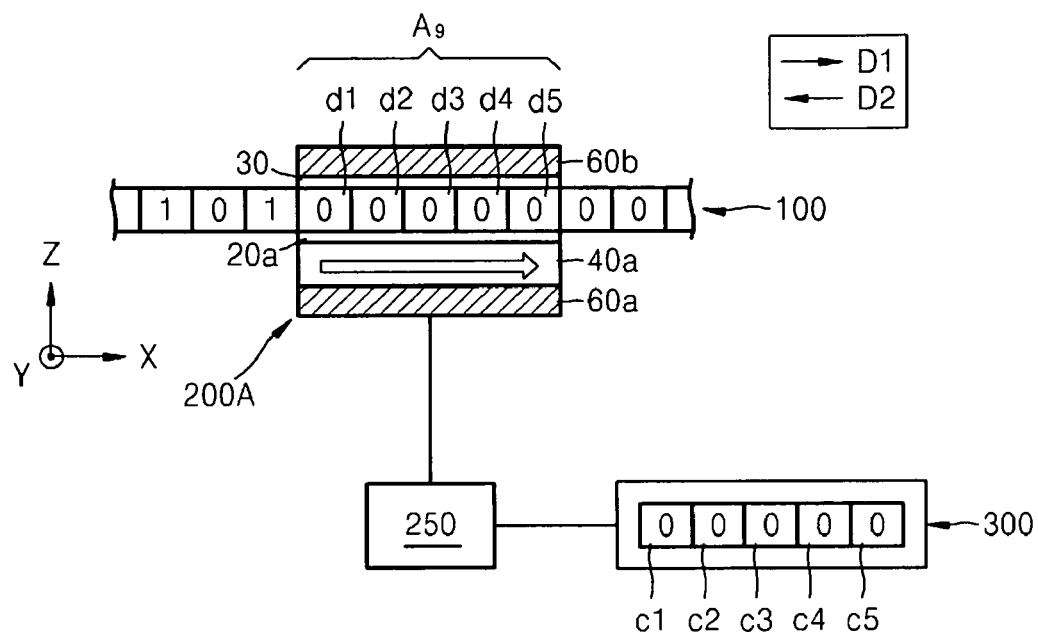
FIGS. 9A to 9G are cross-sectional views illustrating a method of reproducing information from an information storage device according to an example embodiment.

Referring to FIG. 9A, in a beginning stage, each of the first to fifth magnetic domain regions d1 to d5 in the magnetic domain region $A_9$ may store information '0'. Thus, the first through fifth magnetic domain regions d1 to d5 may be magnetized in the first direction D1 (e.g., a direction parallel to the magnetization direction of the first pinned layer 40a). In this case, resistance measured by the first unit 200A may correspond to the first state S1 shown in FIG. 8. Also, information '0' may be recorded in each of the first to fifth memory cells c1 to c5 of the temporary storage device 300. Information may be recorded in the first to fifth memory cells c1 to c5 using an additional writer (not shown). The additional writer may be included in or separate from the control device 250.

As described above, in the beginning stage, the information recorded in the first to fifth magnetic domain regions d1 to d5 may be the same as that recorded in the first to fifth memory cells c1 to c5 of the temporary storage device 300. Meanwhile, information that is to be reproduced may be stored at one or more sides of the magnetic track adjacent to the magnetic domain region $A_9$. In this example, the information to be reproduced is stored at the left side of the magnetic domain region $A_9$.

Figure 9B:
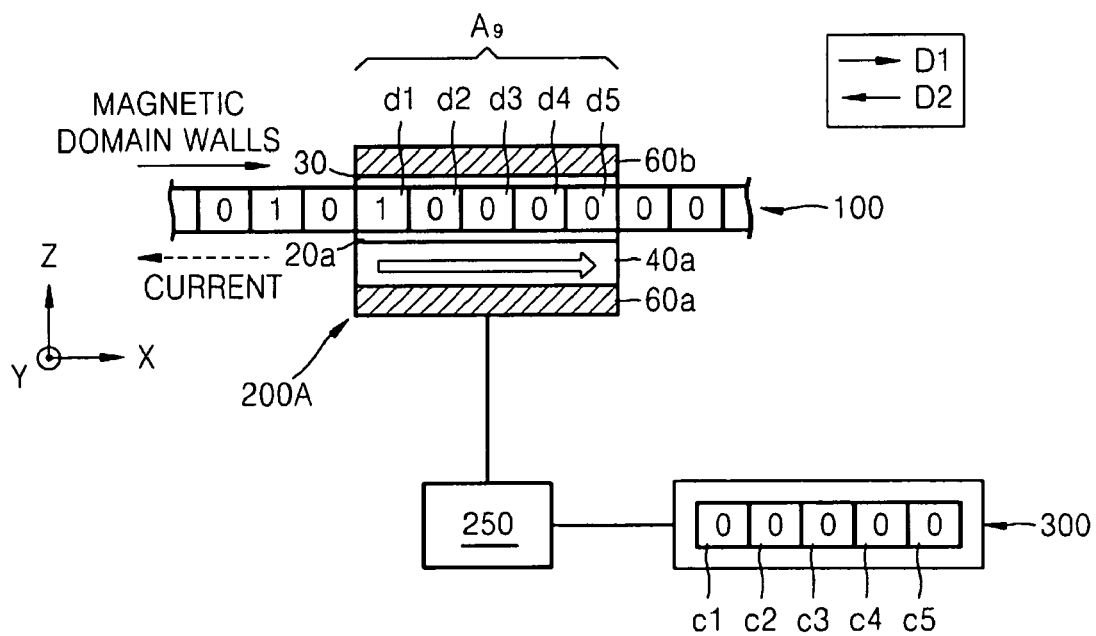

Referring to FIG. 9B, magnetic domain walls may be moved by one bit in the first direction D1 by supplying current to the magnetic track 100 in the second direction D2. Thus, information '1' is input to the magnetic domain region $A_9$ at first magnetic domain d1, and information '0' is output from the magnetic domain region $A_9$. Each of the information stored in the first through fourth magnetic domains d1-d4 is also shifted to the second through fifth magnetic domains d2-d5, respectively. The information recorded in the magnetic domain region $A_9$ is then detected using the first unit 200A. The information recorded in the magnetic domain region $A_9$ is detected based on a change in the measured resistance in the magnetic domain region $A_9$. The resistance in the magnetic domain region $A_9$ may be measured by the first unit 200A. Because information '1' has been input to and information '0' has been output from the magnetic domain region $A_9$ due to the movement of the magnetic domain walls, the information detected using the first unit 200A is information AP1 corresponding to the second state S2 in FIG. 8.

Information stored in the temporary storage device 300 may also be detected. In this example, the information in the temporary storage device 300 is information AP0 corresponding to the first state S1 in FIG. 8. The information stored in the temporary storage device 300 corresponds to the information stored in the magnetic domain region $A_g$ before the movement of the magnetic domain walls shown in FIG. 9B. The information in the magnetic domain region $A_g$ and in the temporary storage device 300 may be detected by the at least one sensor unit included in the control device 250.

The at least one logic unit in the control device 250 then compares the information AP1 in the magnetic domain region $A_9$ with the information AP0 in the temporary storage device 300. If the comparison of the information AP1 and the information AP0 results in a logic value '1' and a logic value '0', respectively, then the control device 250 determines that the information AP1 corresponding to the logic value '1' is greater than information AP0 corresponding to the logic value '0'. The control device 250 also determines that the resistance in the magnetic domain region $A_9$ measured by the first unit 200A after the movement of the magnetic domain walls is greater than before the movement of the magnetic domain walls. Thus, the control device 250 determines that the new information input to the magnetic domain region $A_9$ by the movement of the magnetic domain walls is '1', rather than '0'.

In other words, for example, if information '0' is output from the magnetic domain region $A_9$ by the movement of the magnetic domain walls and the resistance measured in the magnetic domain region $A_9$ by the first unit 200A is greater than before the movement of the magnetic domain walls, the new information input to the magnetic domain region $A_9$ is determined to be '1'. Such a process is a process of reproducing the new information moved into the magnetic domain region $A_9$ by moving the magnetic domain walls.

Figure 9C:
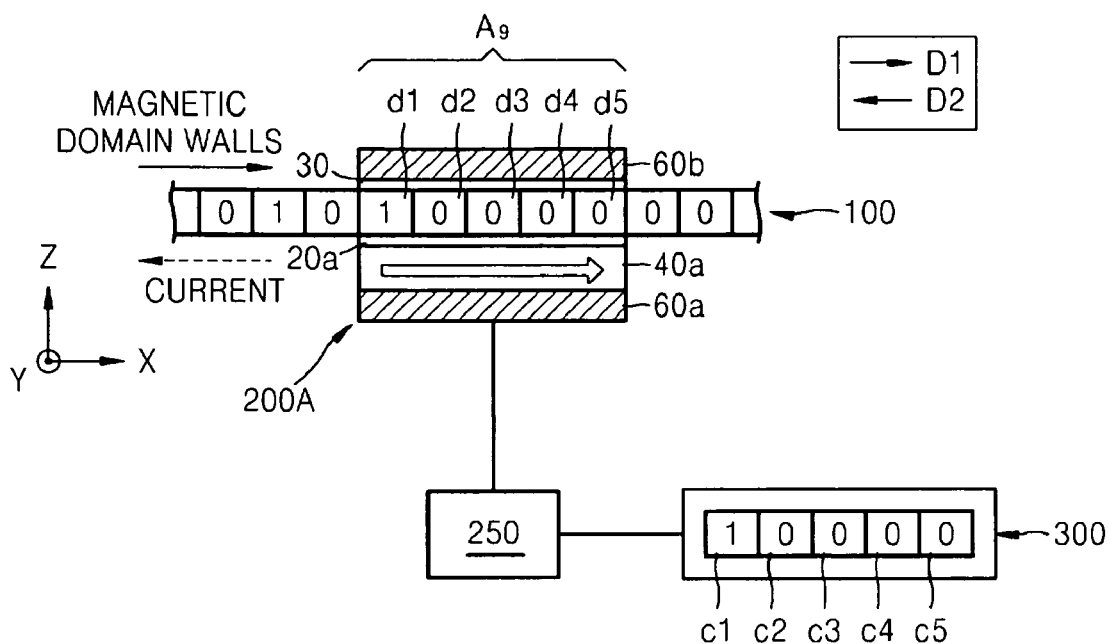

Referring to FIG. 9C, the new information (information '1') input to the magnetic domain region $A_g$ in FIG. 9B is recorded in the first memory cell c1 of the temporary storage device 300. Such recording may be performed using the current-control device included in the control device 250. Also, in this case, information stored in the first to fourth memory cells c1 to c4 of FIG. 9B is moved to the second to fifth memory cells c2 to c5, respectively. The moving of the information in the temporary storage device 300 may be performed by the current-control device or an additional writer. Thus, the information in the first to fifth memory cells c1 to c5 of the temporary storage device 300 in FIG. 9C corresponds to the current information in the first to fifth magnetic domain regions d1 to d5, respectively. As described above, the information in the temporary storage device 300 may be used as reference information in a subsequent reproducing process by equalizing the information in the temporary storage device 300 with the information in the magnetic domain region $A_9$.

Figure 9D:
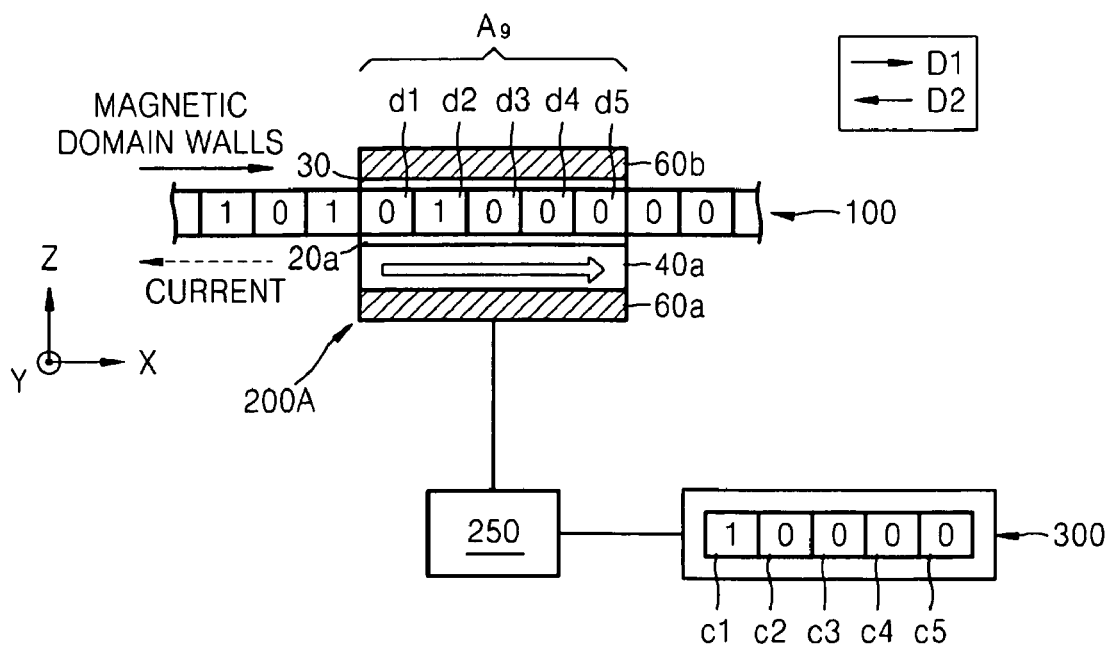

Referring to FIG. 9D, the magnetic domain walls may be moved by one bit in the first direction D1 by supplying current to the magnetic track 100 in the second direction D2. In this case, information '0' is input to and information '0' is output from the magnetic domain region $A_9$. The first unit 200A then detects the information in the magnetic domain region $A_9$ based on a change in the measured resistance in the magnetic domain region $A_9$. The movement of the magnetic domain walls causes information '0' to be input to and information '0' to be output from the magnetic domain region $A_9$. Thus, in this example, the information detected by the first unit 200A is still information AP1 corresponding to the second state S2 in FIG. 8.

The information in the temporary storage device 300 is also detected. Unlike the situation in FIG. 9B, the information in the temporary storage device 300 is also information AP1 corresponding to the second state S2 in FIG. 8. The information in the temporary storage device 300 corresponds to the information in the magnetic domain region $A_9$ before the movement of the magnetic domain walls shown in FIG. 9D.

The at least one logic unit in the control device 250 then compares the information AP1 in the magnetic domain region $A_9$ and the information AP1 in the temporary storage device 300. In this case, the comparison reveals that these pieces of information are the same, which means that the measured resistance in the magnetic domain region $A_9$ after the movement of the magnetic domain walls is the same or substantially the same as the measured resistance in the magnetic domain region $A_9$ before the movement of the magnetic domain walls. Accordingly, the control device 250 determines that the new information input to the magnetic domain region $A_9$ due to the movement of the magnetic domain walls is '0', rather than '1'.

Figure 9E:
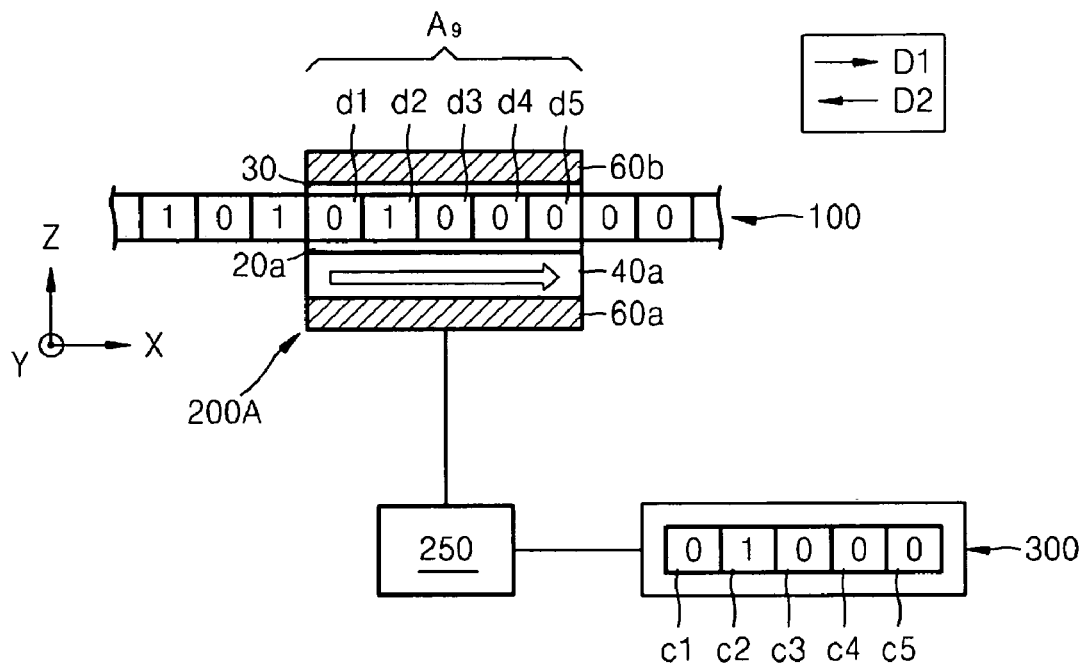

Referring to FIG. 9E, the information (information '0'), which is input to the magnetic domain region $A_9$ in FIG. 9D may be recorded in the first memory cell c1 of the temporary storage device 300. Also, the information in the first to fourth memory cells c1 to c4 of FIG. 9D may be moved to the second to fifth memory cells c2 to c5, respectively. Thus, in FIG. 9E the information in the first to fifth memory cells c1 to c5 of the temporary storage device 300 corresponds to the information in the first to fifth magnetic domain regions d1 to d5, respectively. The process illustrated in FIG. 9E is similar or substantially similar to that illustrated in FIG. 9C.

Figure 9F:
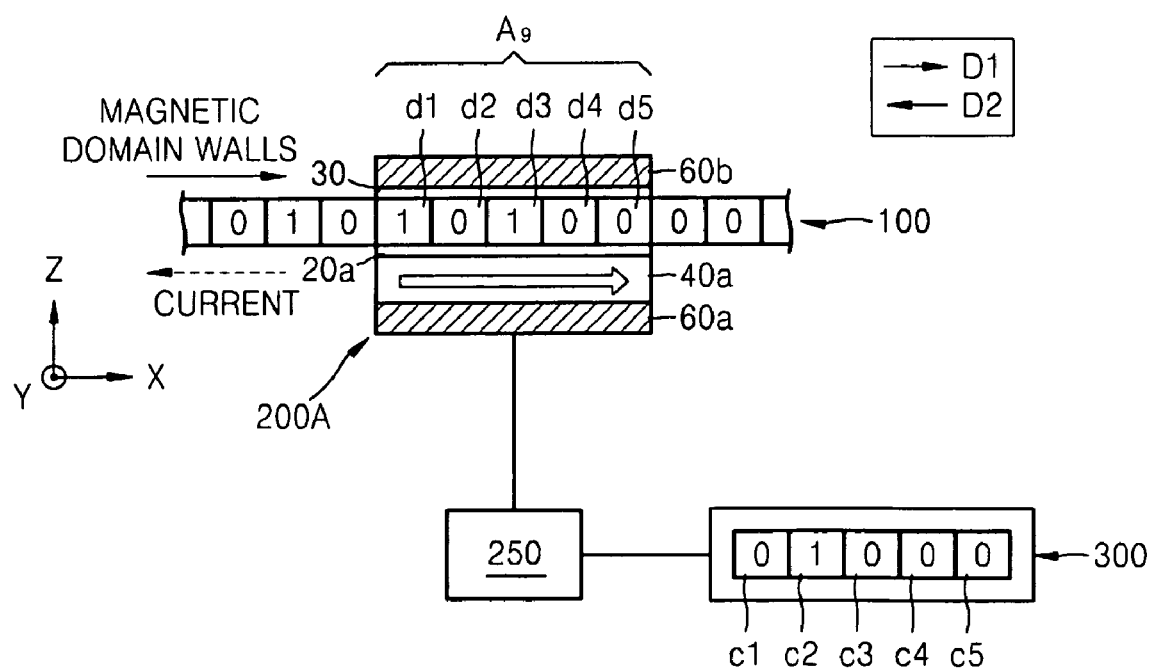

Referring to FIG. 9F, the magnetic domain walls are moved by one bit in the first direction D1 by supplying current to the magnetic track 100 in the second direction D2. Upon moving the magnetic domain walls, information '1' is input to and information '0' is output from the magnetic domain region $A_9$. In this example, the information detected by the first unit 200A is information AP2 corresponding to the third state S3 in FIG. 8. The information in the temporary storage device 300 is information AP1 corresponding to the state of the magnetic domain region $A_9$ before the movement of the magnetic domain walls shown in FIG. 9F. The information input to the magnetic domain region $A_9$ due to the movement of the magnetic domain walls is determined to be '1', for example, by comparing the information AP2 in the magnetic domain region $A_9$ and the information AP1 in the temporary storage device 300 as described above.

Figure 9G:
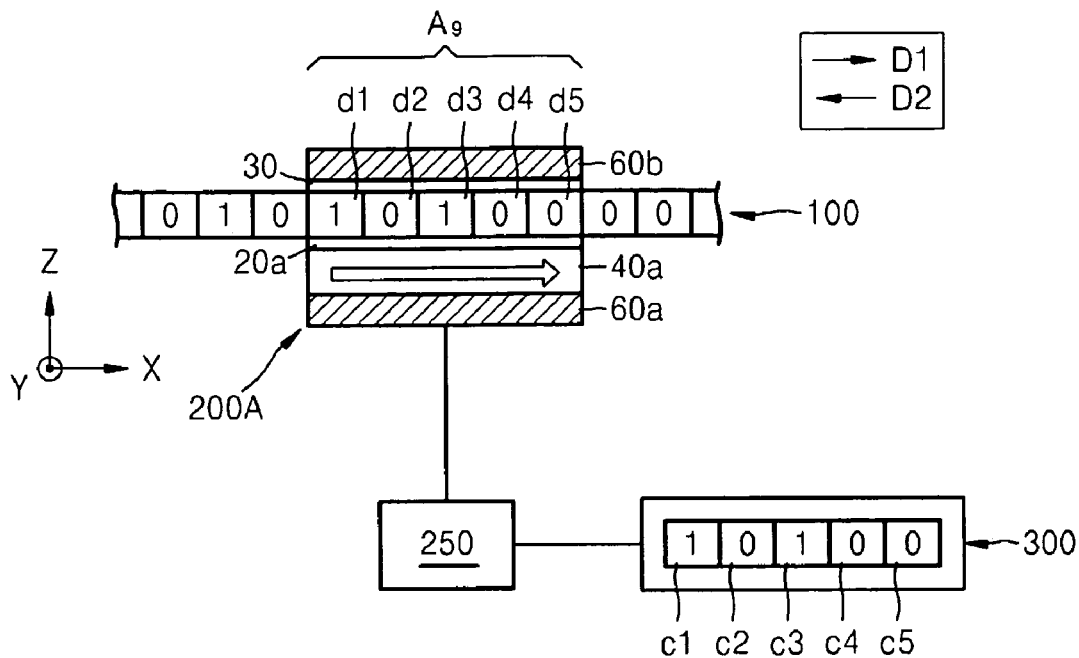

Referring to FIG. 9G, the information in the first to fifth memory cells c1 to c5 may be equalized with the information in the first to fifth magnetic domain regions d1 to d5 as described above with reference to FIGS. 9C and 9E.

In the above-described processes, the type of information output from the magnetic domain region $A_9$ due to the movement of the magnetic domain walls is relatively important because resistance may vary depending on whether information '0' or information '1' is output from the magnetic domain region $A_9$ even if the same information is input to the magnetic domain region $A_9$.

FIGS. 9A to 9G all illustrate example cases in which information '0' is output from the magnetic domain region $A_9$. In this case, if information '1' is input, the resistance measured in the magnetic domain region $A_9$ by the first unit 200A increases. But, if information '0' is input, the measured resistance is remains constant or substantially constant. If information '1' is output from the magnetic domain region $A_9$, the measured resistance remains constant or substantially constant when information '1' is input, but the measured resistance decreases when information '0' is input to the magnetic domain region $A_9$. Accordingly, the manner in which the information is determined may be selected according to information output from the magnetic domain region $A_9$.

A method of reproducing information, which is performed when information '1' is output from the magnetic domain region $A_9$ due to the movement of the magnetic domain walls, will now be described with regard to FIGS. 10A to 10E.

FIGS. 10A to 10E are cross-sectional views illustrating another example embodiment of a method of reproducing information from an information storage device.

Figure 10A:
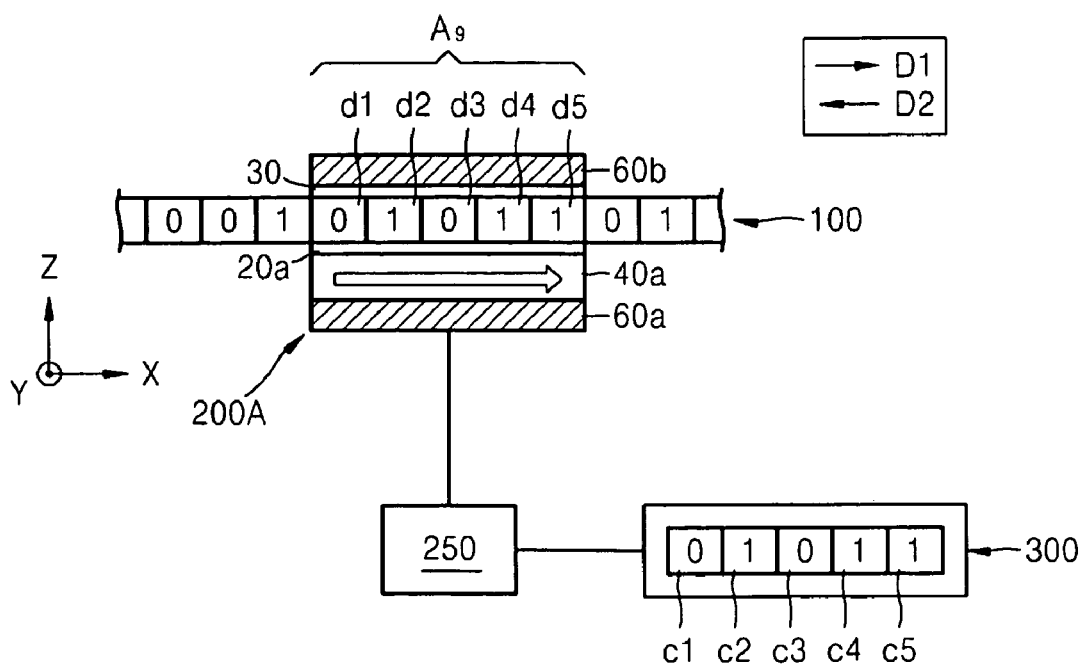
FIGS. 10A to 10E are cross-sectional views illustrating a method of reproducing information from an information storage device according to another example embodiment.

Referring to FIG. 10A, information stored in first to fifth magnetic domain regions d1 to d5 of the magnetic domain region $A_9$ are 0, 1, 0, 1, and 1, respectively. The information stored in first to fifth memory cells c1 to c5 of the temporary storage device 300 is 0, 1, 0, 1, and 1, respectively. But, such an arrangement of information is just an illustrative example. As discussed with respect to this example embodiment, the first to fifth magnetic domain regions d1-d5 are again referred to as the magnetic domain region $A_9$.

Figure 10B:
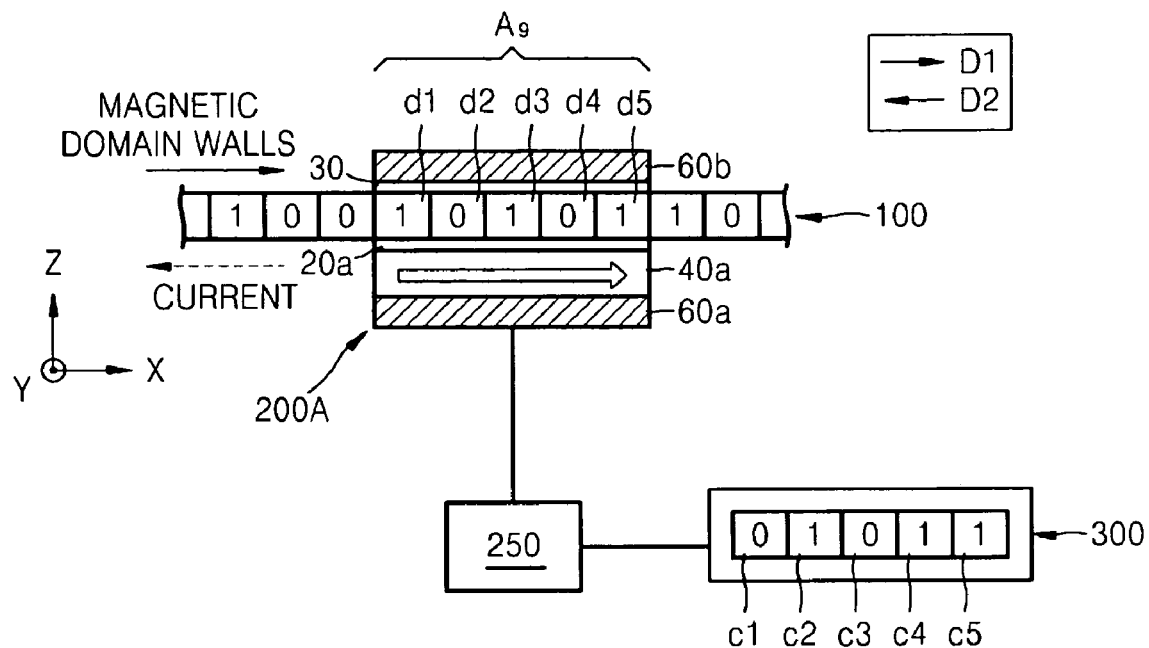

Referring to FIG. 10B, magnetic domain walls are moved by one bit in a first direction D1 by supplying current to a magnetic track 100 in a second direction D2. Thus, in this example, information '1' is input to and information '1' is output from the magnetic domain region $A_9$. Accordingly, the original resistance in the magnetic domain region $A_9$ remains constant or substantially constant. If information AP3 in the magnetic domain region $A_9$, which is detected by the first unit 200A, and information AP3 in the temporary storage region 300 are the same, then information '1' is determined to be input to the magnetic domain region $A_9$.

Figure 10C:
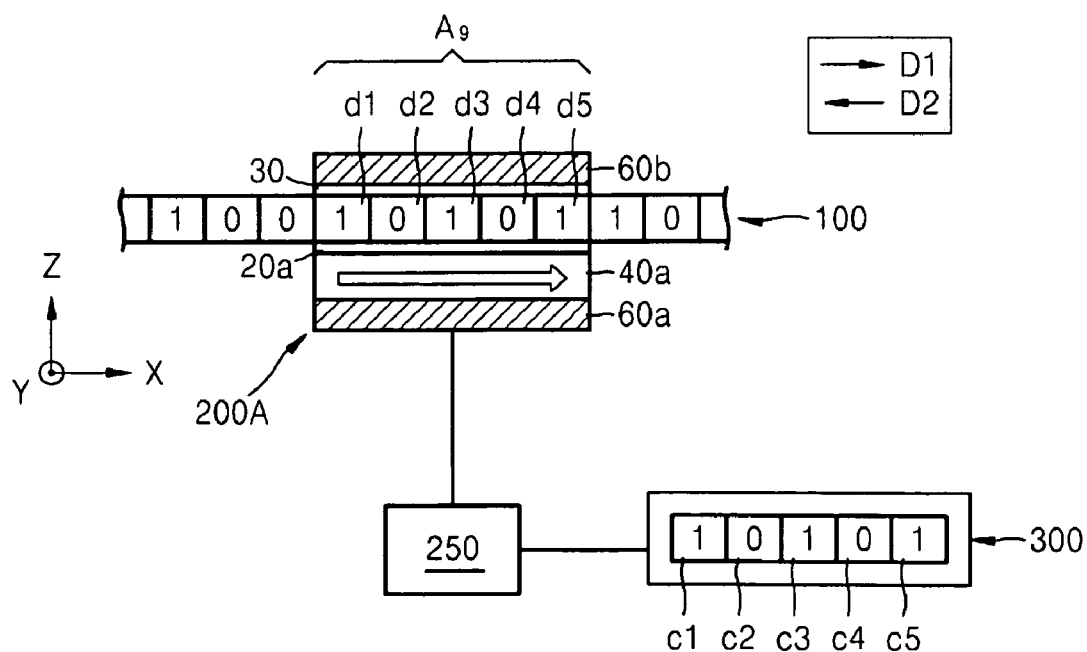

Referring to FIG. 10C, information (e.g., information '1'), which is input to the magnetic domain region $A_9$ in FIG. 10B, is recorded in the first memory cell c1 of the temporary storage device 300. Also, the information in the first to fourth memory cells c1 to c4 of FIG. 10B moves to the second to fifth memory cells c2 to c5, respectively. Thus, referring to FIG. 10C, the information in the first to fifth memory cells c1 to c5 of the temporary storage device 300 corresponds to the information in the first to fifth magnetic domain regions d1 to d5, respectively.

Figure 10D:
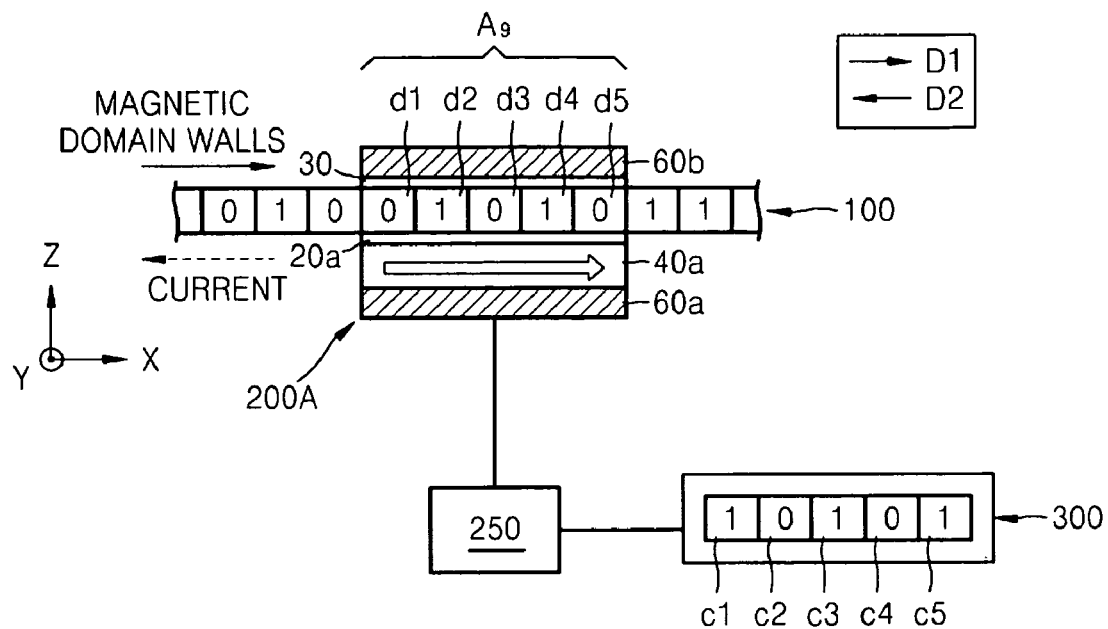

Referring to FIG. 10D, the magnetic domain walls may be moved as described above with reference to FIG. 10B. In this example, information '0' is input to and information '1' is output from the magnetic domain region $A_9$, and the resistance measured in the magnetic domain region $A_9$ by the first unit 200A decreases accordingly. When a logic value of the information AP2 in the magnetic domain region $A_g$ is determined to be less than that of the information AP3 in the temporary storage device 300 by comparing the information AP2 in the magnetic domain region $A_9$ with the information AP3 in the temporary storage device 300, then information '0' is determined to be input to the magnetic domain region $A_9$ due to the movement of the magnetic domain walls.

Figure 10E:
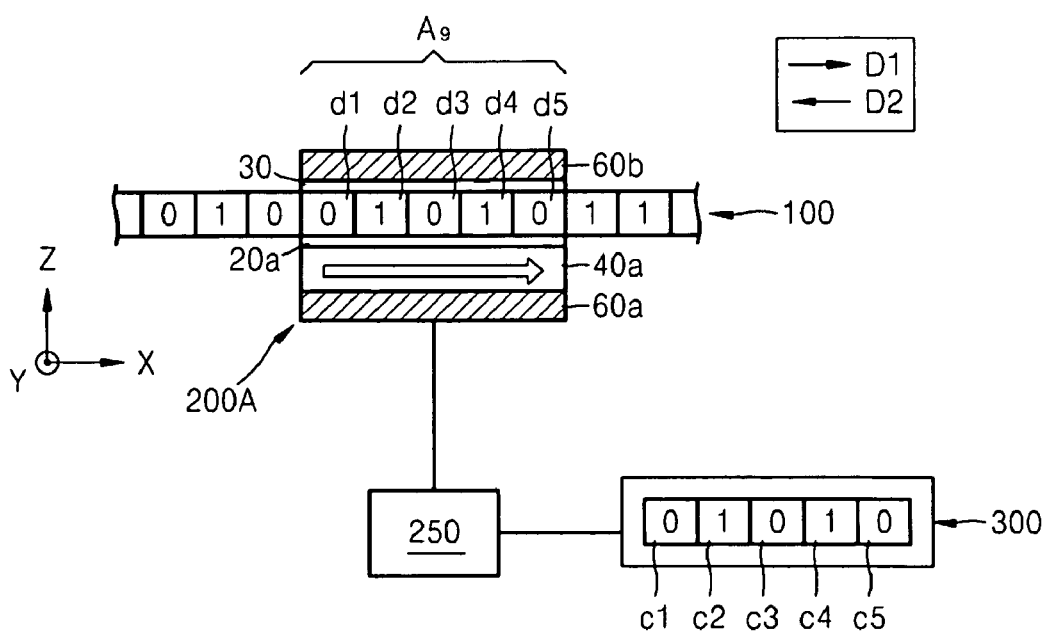

Referring to FIG. 10E, the information stored in the first to fifth memory cells c1 to c5 is equalized with the information stored in the first to fifth magnetic domain regions d1 to d5 as described above with reference to FIG. 10C.

As described above, even if the same information is input to the magnetic domain region $A_g$ during a reproduction process, the resistance may vary depending on whether information '0' or information '1' is output from the magnetic domain region $A_9$, and thus, the type of information output from the magnetic domain region $A_9$ due to the movement of the magnetic domain walls is relatively important. Thus, a method of determining information may be selected after checking information output from the magnetic domain region $A_9$ due to the movement of the magnetic domain walls.

If the output information is '0' and the measured resistance in the magnetic domain region $A_g$ increases after the movement of the magnetic domain walls, then information '1' is determined to be input to the magnetic domain region $A_9$.

If the output information is '1' and the measured resistance in the magnetic domain region $A_9$ remains constant or substantially constant after the movement of the magnetic domain walls, then information '1' is determined to be input to the magnetic domain region $A_9$.

If the output information is '0' and the measured resistance in the magnetic domain region $A_9$ remains constant or substantially constant after the movement of the magnetic domain walls, then information '0' is determined to be input to the magnetic domain region $A_9$.

If the output information is '1' and the measured resistance in the magnetic domain region $A_9$ decreases after the movement of the magnetic domain walls, then information '0' is determined to be input to the magnetic domain region $A_9$.

The type of information output from magnetic domain region $A_9$ may be determined by checking the information stored in the fifth memory cell c5 of the temporary storage device 300 before the movement of the magnetic domain walls because the states of the first to fifth memory cells c1 to c5 are maintained to be same (e.g., equalized) as those of the first to fifth magnetic domain regions d1 to d5. A method in which the type of information is determined may be selected according to the result of checking the information in the fifth memory cell c5. Because the number of types of output information is two (e.g., '0' or '1'), the number of methods of determining the type of information is also two. The logic device included in the control device 250 may be used to select one from among two methods of reproducing information. The logic device will be apparent to those of ordinary skill in the art, and thus, a detailed description thereof will not be provided.

According to example embodiments, the first unit 200 may be disposed on a given, desired or predetermined region (e.g., central or first region A1 of the magnetic track 100), rather than at an end of the magnetic track 100 as illustrated in FIG. 1. In this example, a region of the magnetic track 100 located at a first side of the first unit 200 may serve as a buffer region, whereas a region of the magnetic track 100 located at a second side of the first unit 200 may serve as an effective storage region. Information may be recorded or reproduced while moving magnetic domains of the magnetic domain regions D of the magnetic track 100, which are located at the first side of the first unit 200, toward the second side of the first unit 200. The magnetic domains moved toward the second side of the first unit 200 may be moved again toward the first side of the first unit 200 after completing the recording or the reproducing of the information. Accordingly, in this information storage device is bi-directional in that the magnetic domain walls may be moved in the X-axis direction or in a direction opposite to the X-axis direction.

An information storage device such as that illustrated in FIG. 1 may be constructed in various ways.

Figure 11:
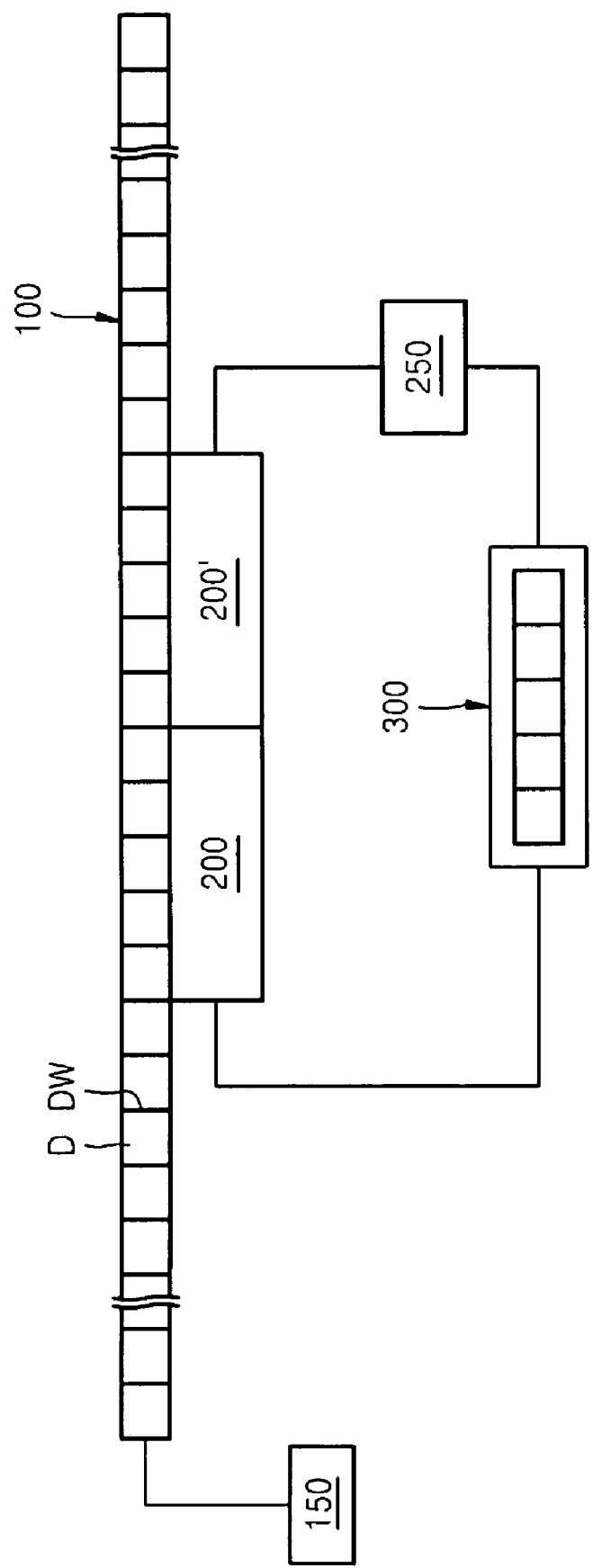
FIG. 11 is a cross-sectional view of an information storage device according to another example embodiment.

FIG. 11 is a cross-sectional view of another example embodiment of an information storage device.

Referring to FIG. 11, in this example embodiment first and second units 200 and 200' are disposed adjacent to each other on (e.g., below) a magnetic track 100 at a given, desired or predetermined region of the magnetic track 100, rather than at respective ends of the magnetic track 100. In this example embodiment, no magnetic domain region D is present between the first and second units 200 and 200'.

Although the first and second units 200 and 200' are illustrated as contacting each other in FIG. 11, they may be separated from each other. For example, one or more magnetic domain regions D may be present between the first and second units 200 and 200'. In another example, a magnetic domain wall region DW may be arranged between the first and second units 200 and 200'. The magnetic domain D and/or magnetic domain wall region DW may have a given, desired or predetermined volume.

According to example embodiments, one of the first and second units 200 and 200' may be located at the bottom of the magnetic track 100, whereas the other unit 200 or 200' may be located at the top of the magnetic track 100. One of the first and second units 200 and 200' (e.g., the first unit 200) may be a write unit and the other unit (e.g., the second unit 200') may be a read unit.

Referring back to FIG. 11, a temporary storage device 300 is connected to the first and second units 200 and 200'. A control device 250 may be interposed between at least one of the first and second units 200 and 200' and the temporary storage device 300. In the example embodiment shown in FIG. 11, the control device 250 is connected between the second unit 200' and the temporary storage device 300.

The constructions of the first and second units 200 and 200' may be the same or different from one another. In one example, the first unit 200 may be used to record a plurality of pieces (e.g., bits) of information on the magnetic track 100, whereas the second unit 200' may be used to reproduce recorded information. While information is recorded on the magnetic track 100, the information may also be recorded on the temporary storage device 300. Information stored in the temporary storage device 300 may be used in the above-described reproducing operation. Methods of recording and reproducing information using the information storage device of FIG. 11 will now be described in more detail with regard to FIGS. 12A to 12C.

Figure 12A:
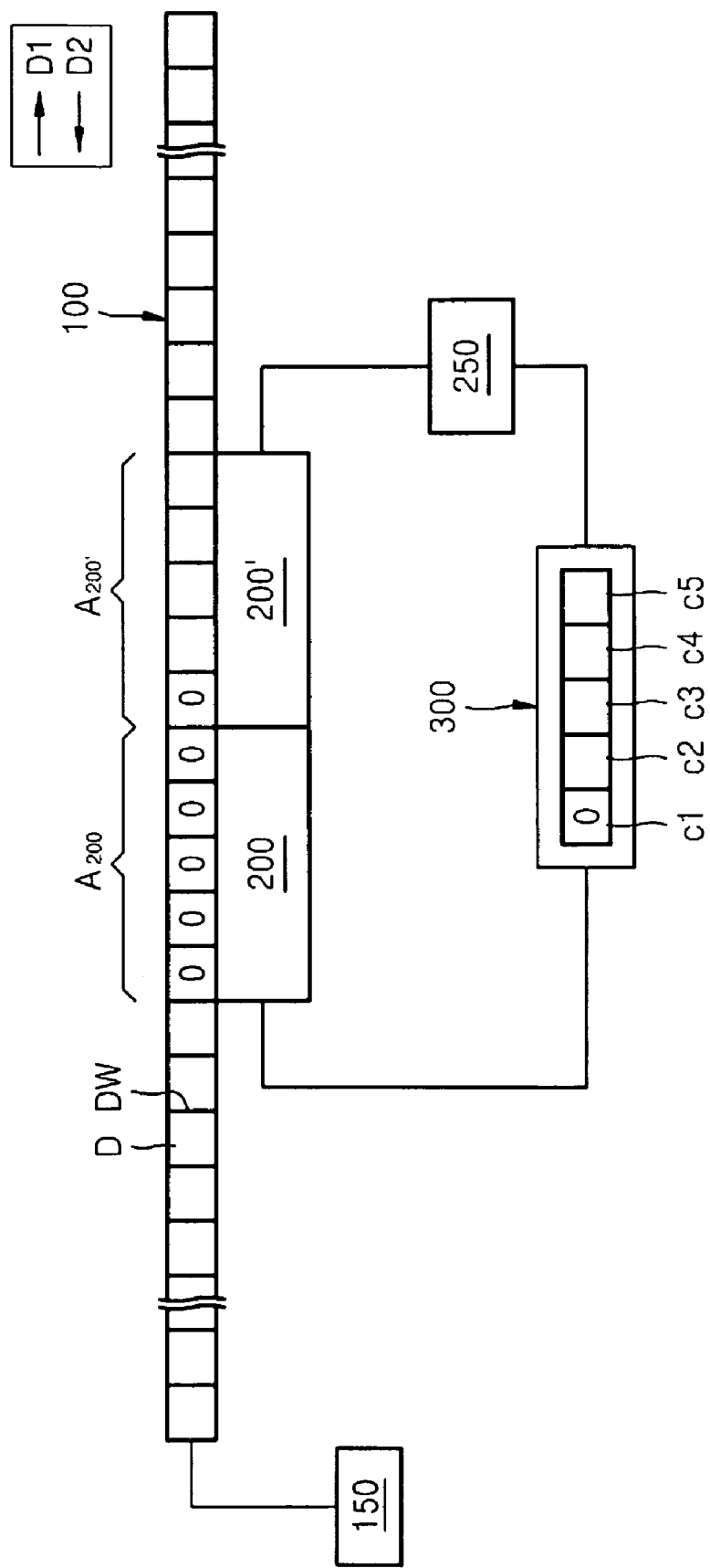
Figure 12C:
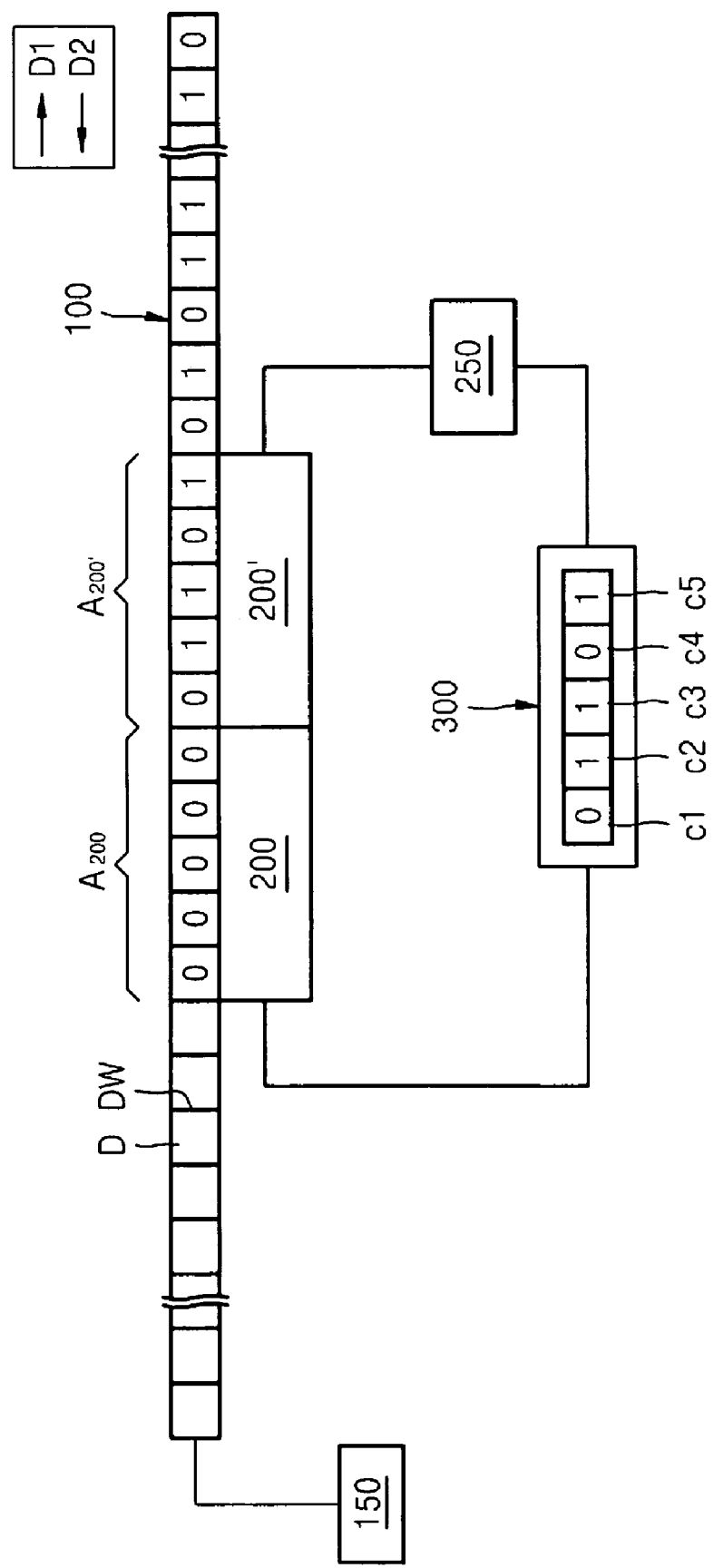

FIGS. 12A to 12C are cross-sectional views illustrating an example embodiment of a method of operating the information storage device of FIG. 11. In the example embodiment shown in FIGS. 12A to 12C, the region of the magnetic track 100 on which the first unit 200 is disposed is referred to as the first magnetic domain region $A_{200}$. The region of the magnetic track 100 on which the second unit 200' is disposed is referred to as the second magnetic domain region $A_{200'}$.

Referring to FIG. 12A, in this example, information '0' is recorded at a magnetic domain region D of the second magnetic domain region $A_{200'}$ that is adjacent to the first magnetic domain region $A_{200}$ in the right direction by supplying the first write current to the first unit 200 and moving magnetic domain walls by one bit in a first direction D1. Information '0' is also recorded on a first memory cell c1 of a temporary storage device 300.

Referring to FIG. 12B, information '1' is recorded in the magnetic domain region D of the second magnetic domain region $A_{200'}$ adjacent to the first magnetic domain region $A_{200}$ in the right direction by supplying second write current to the first unit 200 and moving magnetic domain walls by one bit in the first direction D1. The information '0' recorded in the operation shown in FIG. 12A is shifted one magnetic domain region D to the right. In this example process, information '1' is also recorded on the first memory cell c1 of the temporary storage device 300. The information '0', previously stored in the first memory cell c1, is moved to a second memory cell c2 of the temporary storage device 300. As described above, information recorded on the magnetic track 100 is also stored in the temporary storage device 300.

FIG. 12C is a cross-sectional view of an information storage device in which a given, desired, or predetermined recording process is completed.

Referring to FIG. 12C, given, desired, or predetermined information has been recorded in magnetic domain regions D to the right of the first magnetic domain region $A_{200}$. Information 0, 1, 1, 0, 1 recorded in the second magnetic domain region $A_{200'}$ corresponds to (e.g., is the same as) the information 0, 1, 1, 0, 1 recorded in the temporary storage device 300. More generally, for example, the five most recently recorded pieces or bits of information in the recording process are also stored in the temporary storage device 300. The recorded information may be reproduced using the second unit 200' while moving magnetic domain walls of the magnetic track 100 by one bit in the second direction D2 (e.g., to the left in FIG. 12C). The information may be reproduced as described above with reference to FIGS. 9A through 10E.

When reproduction of the information starts, the information in the second magnetic domain region $A_{200'}$ may be the same as the information stored in the temporary storage device 300. For example, the information stored in the second magnetic domain region $A_{200'}$ may be the same as the information stored in the temporary storage device 300 before the magnetic domain walls are moved in order to reproduce the information. Thus, the information in the temporary storage device 300 may be used as reference information during the reproducing of the information.

During the reproducing of information, the temporary storage device 300 may be updated to have the same information as the information in the second magnetic domain region $A_{200'}$ as described above with reference to FIGS. 9A through 10E.

Still referring to FIGS. 11-12C, if at least one magnetic domain region D is present between the first and second units 200 and 200', the information in the second magnetic domain region $A_{200'}$ may be equalized with the information in the temporary storage device 300 by moving the magnetic domain walls within the magnetic track 100 after completing a recording process. For example, if five magnetic domain regions D are present between the first and second units 200 and 200' in FIG. 12C, the magnetic domain walls may be moved by five bits in the first direction D1 to equalize the information in the second magnetic domain region $A_{200'}$ with the information stored in the temporary storage device 300.

Figure 13:
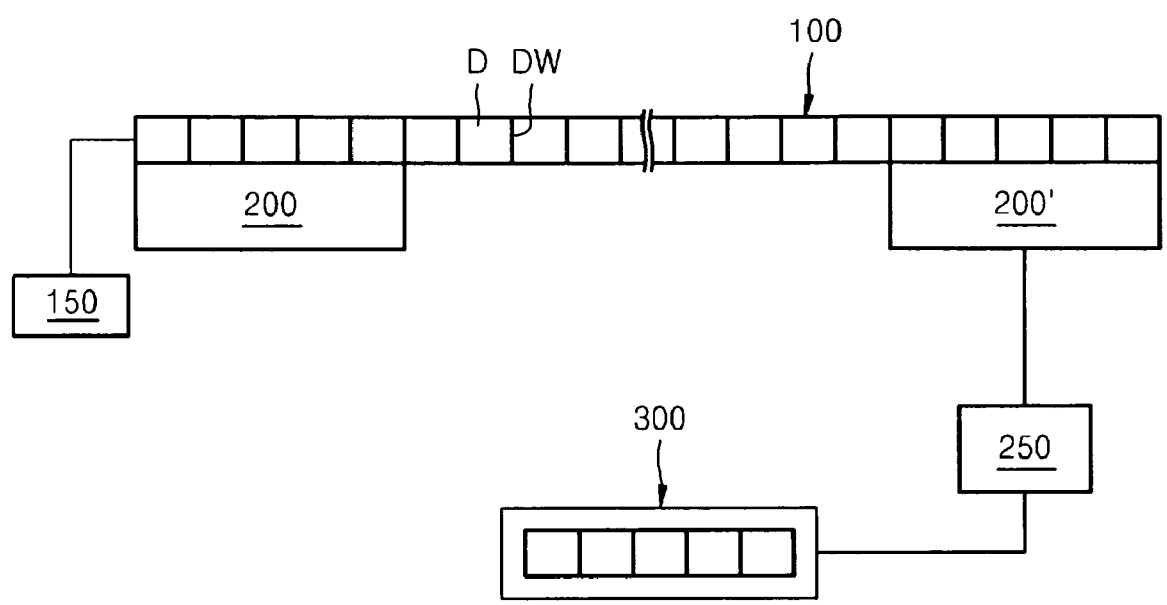
FIGS. 13 and 14 are cross-sectional views of information storage devices according to other example embodiments.
Figure 14:
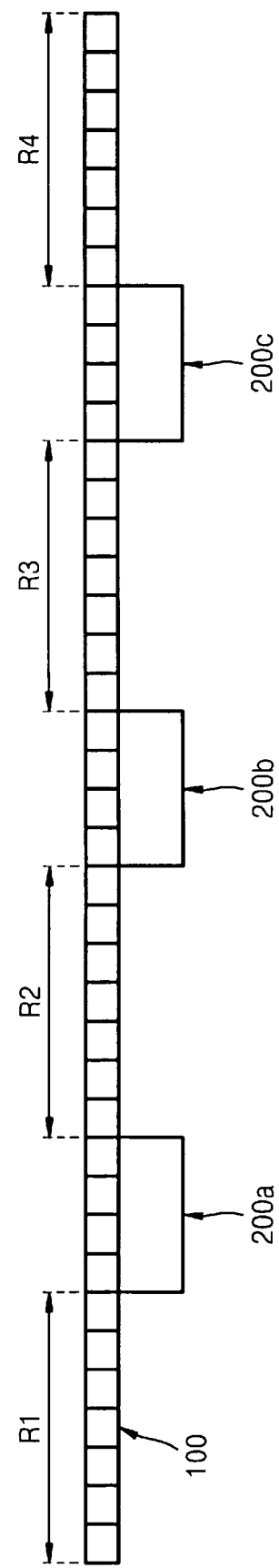

FIGS. 13 and 14 are cross-sectional views of information storage devices according to other example embodiments.

Referring to FIG. 13, in this example embodiment a first unit 200 is disposed at a first end of a magnetic track 100 and a second unit 200' is disposed at a second end of the magnetic track 100. One of first and second units 200 and 200' (e.g., the first unit 200) may be a write unit and the other (e.g., the second unit 200') may be a read unit. The second unit 200' is connected to a temporary storage device 300. A control device 250 is connected between the second unit 200' and the temporary storage device 300.

In a method of reproducing information using the information storage device as shown in FIG. 13, information may be reproduced from the second end of the magnetic track 100 by the second unit 200', and the reproduced information may be recorded on the first end of the magnetic track 100 by the first unit 200 while moving magnetic domain walls by one bit. More generally, the information reproduced from the second end of the magnetic track 100 may be transferred to and stored at the first end thereof. If information reproduced from the second end of the magnetic track 100 is repeatedly transferred to the first end thereof while moving the magnetic domain walls, the state of the magnetic track 100 after completion of the reproducing process may be the same as before the reproducing process began. Thus, in this example embodiment information may be reproduced while moving the magnetic domain walls in only one direction (e.g., the direction from the first end of the magnetic track 100 to the second end thereof).

Although not shown in FIG. 13, an additional control device may be arranged between the first and second units 200 and 200' to transfer information read by the second unit 200' to the first unit 200. The additional control device may be connected either to the temporary storage device 300 or the control device 250. Meanwhile, to record information, a given, desired, or predetermined write current may be supplied to the first unit 200 and the magnetic domain walls DW may be moved toward the second end of the magnetic track 100. Such a recording method may be performed in the manner described above with reference to FIGS. 7A to 7E.

FIG. 14 is a cross-sectional view of another example embodiment of an information storage device.

Referring to FIG. 14, in this example embodiment a plurality of units 200a-200c are disposed at intervals (e.g., equal intervals of magnetic domains) on a magnetic track 100. Each of the plurality of units 200a-200c may be the same or substantially the same as the first unit 200 of FIG. 1. As discussed herein, the plurality of units 200a-200c are referred to as third unit 200a, fourth unit 200b, and fifth unit 200c. Each of the third to fifth units 200a, 200b, and 200c may be read units, write units or read/write units. Although not shown, each of the third to fifth units 200a, 200b, and 200c may be connected to a control device and a temporary storage device such as the control device 250 and the temporary storage 300 shown in FIG. 13.

The third to fifth units 200a, 200b, and 200c may be spaced a given, desired, or predetermined distance from one another. For example, the magnetic track 100 in FIG. 14 is divided into four regions (referred to herein as first to fourth regions R1 to R4) by the third to fifth units 200a, 200b, and 200c. The first region R1 extends from the left end of the magnetic track 100 to the left end of third unit 200a. The second region R2 extends from the right end of the third unit 200a to the left end of the fourth unit 200b. The third region R3 extends from the right end of the fourth unit 200b to the left end of the fifth unit 200c. The fourth region R4 extends from the right end of the fifth unit 200c to the right end of the magnetic track 100.

In an example embodiment of a recording method using the information storage device shown in FIG. 14, information (e.g., given, desired, or predetermined information) may be recorded on magnetic domain regions D of the second to fourth regions R2 to R4 using the third to fifth units 200a, 200b, and 200c while moving magnetic domain walls in a first direction D1. The recorded information may be reproduced by the third to fifth units 200a, 200b, and 200c while moving the magnetic domain walls in a second direction D2.

After the reproducing process is completed, the information may be moved to its original location before the reproducing process began. In this example, the first region R1 may be used as a buffer region. If recording and reproducing are performed using a plurality of units as described above, recording and/or reproducing speeds may be increased. Also, a ratio of the size of an effective storage region to a buffer region in the magnetic track 100 may be higher than when only one unit 200 is used in FIG. 1.

As described above, according to example embodiments, information may be recorded on and/or reproduced from a unit magnetic domain region D by using a unit (e.g., read/write unit), which is larger than the unit magnetic domain region D. Accordingly, recording density may be reduced by reducing the size of the magnetic domain region D. And, manufacturing of a write unit, a read unit and/or a read/write unit may be simplified. For example, one magnetic domain may have a width of about 10 nm, whereas the write unit, read unit and/or read/write unit may have a width of about 50 to about 60 nm, inclusive.

It should be understood that the example embodiments described herein should be considered in a descriptive sense only and not for purposes of limitation. For example, it would be apparent to those of ordinary skill in the art that the constructions of the information storage devices illustrated in FIGS. 1 to 6, 11, 13 and 14 and the methods illustrated in FIGS. 7A to 7E, 9A to 10E and 12A to 12C may be modified in various ways. Also, FIGS. 7A to 7E and 9A to 10E illustrate cases where the magnetic track 100 and the first pinned layer 40a are horizontally magnetically anisotropic, but the magnetic track 100, the first pinned layer 40a and the second pinned layer 40b may be vertically magnetically anisotropic. Descriptions of features or aspects within each example embodiment should typically be considered as available for other similar features or aspects in other example embodiments.

What is claimed is:

1. An information storage device comprising:
   a magnetic track including a plurality of magnetic domains and a magnetic domain wall between each pair of adjacent magnetic domains; and
   a first operating unit on at least two adjacent magnetic domains among the plurality of magnetic domains of the magnetic track, the first operating unit being configured to perform at least one of writing data and reading data with respect to the at least two adjacent magnetic domains.

2. The device of claim 1, further comprising:
   a magnetic domain wall moving unit connected to the magnetic track.

3. The device of claim 1, further comprising:
   a temporary information storage device connected to the first operating unit.

4. The device of claim 3, wherein the temporary information storage device is a non-volatile memory device.

5. The device of claim 3, wherein the temporary information storage device comprises:
   a plurality of memory cells, a total number of memory cells among the plurality of memory cells being equal to a total number of magnetic domains covered by the first operating unit.

6. The device of claim 3, further comprising:
   a control device connected between the first operating unit and the temporary information storage device.

7. The device of claim 1, wherein the first operating unit is one of a write unit, a read unit, and a read/write unit.

8. The device of claim 1, wherein the first operating unit comprises:
   one of a tunnel magneto-resistance (TMR) device and a giant magneto-resistance (GMR) device.

9. The device of claim 1, further comprising:
   a second operating unit, which is separate from the first operating unit; wherein
   one of the first and second operating units is a write unit and the other is a read unit.

10. The device of claim 9, wherein the second operating unit covers at least two adjacent magnetic domains among the plurality of magnetic domains.

11. The device of claim 10, wherein a total number of magnetic domains covered by the first operating unit is equal to a total number of magnetic domains covered by the second operating unit.

12. The device of claim 9, further comprising:
   a temporary information storage device connected to the first and second operating units.

13. The device of claim 9, wherein the second operating unit comprises:
   one of a tunnel magneto-resistance (TMR) device and a giant magneto-resistance (GMR) device.

14. The device of claim 9, wherein the first and second operating units are arranged adjacent to each other.

15. The device of claim 9, wherein the first operating unit is arranged at a first end of the magnetic track and the second operating unit is arranged at a second end of the magnetic track.

16. The device of claim 1, further comprising:
   a plurality of additional operating units; wherein
   the first and the plurality of additional operating units are separated from one another on the magnetic track.

17. A method of operating an information storage device including a magnetic track having a plurality of magnetic domains and a magnetic domain wall between each pair of adjacent magnetic domains, the information storage device further including an operating unit having a size sufficient to cover at least two adjacent magnetic domains among the plurality of magnetic domains, the method comprising:
   recording information on the magnetic track, the recording of the information including,
       magnetizing all of the plurality of magnetic domains covered by the operating unit in a first direction by supplying a first write current to the operating unit.

18. The method of claim 17, wherein the information storage device further includes a magnetic domain wall moving unit connected to the magnetic track, the recording of the information further comprising:
moving the magnetic domain walls of the magnetic track by at least one bit after supplying the first write current.

19. The method of claim 18, wherein the recording of the information further comprises:
magnetizing all the magnetic domains covered by the operating unit in a second direction by supplying a second write current to the operating unit after the moving of the magnetic domain walls by at least one bit.

20. The method of claim 19, wherein the first direction in which the magnetic domains are magnetized by supplying the first write current is opposite to the second direction in which the magnetic domains are magnetized by supplying the second write current.

21. The method of claim 19, wherein the recording of the information further comprises:
moving the magnetic domain walls of the magnetic track by at least one bit after the supplying the second write current.

22. The method of claim 17, further comprising:
magnetizing all the magnetic domains of the magnetic track in the same direction before the recording the information on the magnetic track.

23. The method of claim 17, wherein the information storage device further includes a temporary information storage device connected to the operating unit.

24. The method of claim 23, wherein the temporary information storage device includes a plurality of memory cells, a total number of memory cells among the plurality of memory cells being equal to a total number of magnetic domains covered by the operating unit.

25. The method of claim 23, further comprising:
storing information recorded on the magnetic track in the temporary information storage device.

26. The method of claim 25, further comprising:
reproducing the information recorded on the magnetic track using the information stored in the temporary information storage device.

27. The method of claim 26, wherein the reproducing of the information is performed using the operating unit or an additional read unit.

28. The method of claim 27, wherein the reproducing of the information comprises:
reading, in a first operation, information from the magnetic domains covered by the operating unit or information from magnetic domains covered by the additional read unit;
moving, in a second operation, magnetic domain walls of the magnetic track by one bit; and
reading, in a third operation, information from magnetic domains covered by the operating unit or information from the read unit after performing the second operation.

29. The method of claim 28, wherein the reproducing of the information comprises:
storing the information read in the first operation in the temporary information storage device.

30. The method of claim 29, wherein the reproducing of the information comprises:
determining a type of information in a magnetic domain moved to a first region of the magnetic track in the second operation by comparing the information read in the third operation with the information stored in the temporary information storage device; wherein
the first region of the magnetic track is a region of the magnetic track on which the operating unit or the read unit is disposed.

31. The method of claim 30, further comprising:
equalizing the information in the temporary information storage device with the information read in the third operation after determining the type of information of the magnetic domain moved to the first region.

32. A method of operating an information storage device including a magnetic track having a plurality of magnetic domains and a magnetic domain wall arranged between each pair of adjacent magnetic domains, the information storage device further including a magnetic domain wall moving unit and an operating unit, the magnetic domain wall moving unit is connected to the magnetic track and the operating unit has a size sufficient to cover at least two magnetic domains among the plurality of magnetic domains, the method comprising:
moving the magnetic domain walls of the magnetic track by one bit; and
determining a type of information in a magnetic domain moved into a first region of the magnetic track by the movement of the magnetic domain walls, the first region of the magnetic track being a region of the magnetic track on which the operating unit is disposed.

33. The method of claim 32, wherein the determining of the type of information comprises:
comparing information stored in the first region after the movement of the magnetic domain walls with information stored in the first region before the movement of the magnetic domain walls.

34. The method of claim 33, wherein the information storage device further includes a temporary information storage device for storing the information stored in the first region before moving the magnetic domain walls.

35. The method of claim 34, further comprising:
equalizing information stored in the temporary information storage device with information stored in the first region after determining the type of information of the magnetic domain moved to the first region of the magnetic track.

36. The method of claim 32, further comprising:
checking information that is moved out from the first region by the movement of the magnetic domain walls; wherein
a method of determining the type of information is selected according to the type of the information moved out from the first region.

37. The device of claim 1, wherein the first operating unit continuously covers the at least two adjacent magnetic domains and at least one magnetic domain wall between the at least two adjacent magnetic domains.

38. An information storage device comprising:
a magnetic track including a plurality of magnetic domains and a magnetic domain wall between each pair of adjacent magnetic domains;
a first operating unit having a size sufficient to cover at least two adjacent magnetic domains among the plurality of magnetic domains; and
a second operating unit, which is separate from the first operating unit and covers at least two adjacent magnetic domains among the plurality of magnetic domains, wherein
one of the first and second operating units is a write unit and the other is a read unit.

* * * * *